(12) United States Patent
Yeh et al.

(10) Patent No.: US 10,985,149 B2
(45) Date of Patent: Apr. 20, 2021

(54) SEMICONDUCTOR DEVICE PACKAGE AND METHOD OF MANUFACTURING THE SAME

(71) Applicant: Omnivision Technologies, Inc., Santa Clara, CA (US)

(72) Inventors: Chien Chan Yeh, Changhua County (TW); Ying-Chih Kuo, Hsinchu (TW); Wei-Feng Lin, Hsinchu County (TW)

(73) Assignee: Omnivision Technologies, Inc, Santa Clara, CA (US)

( * ) Notice: Subject to any disclaimer, the term of this patent is extended or adjusted under 35 U.S.C. 154(b) by 0 days.

(21) Appl. No.: 16/248,125

(22) Filed: Jan. 15, 2019

(65) Prior Publication Data
US 2020/0227394 A1    Jul. 16, 2020

(51) Int. Cl.
| | | |
|---|---|---|
| *H01L 25/16* | (2006.01) | |
| *H01L 23/31* | (2006.01) | |
| *H01L 23/00* | (2006.01) | |
| *H01L 23/538* | (2006.01) | |
| *H01L 21/56* | (2006.01) | |

(52) U.S. Cl.
CPC ......... *H01L 25/167* (2013.01); *H01L 21/565* (2013.01); *H01L 23/3121* (2013.01); *H01L 23/3171* (2013.01); *H01L 23/5384* (2013.01); *H01L 24/17* (2013.01); *H01L 24/33* (2013.01); *H01L 24/49* (2013.01); *H01L 24/73* (2013.01); *H01L 2224/0231* (2013.01); *H01L 2224/02373* (2013.01)

(58) Field of Classification Search
CPC ... H01L 27/14627; H01L 24/05; H01L 24/17; H01L 24/49; H01L 24/73; H01L 24/97; H01L 25/167
See application file for complete search history.

(56) References Cited

U.S. PATENT DOCUMENTS

| | | | | |
|---|---|---|---|---|
| 5,291,062 | A * | 3/1994 | Higgins, III | H01L 23/04 257/693 |
| 5,532,513 | A * | 7/1996 | Smith | H01L 23/08 257/703 |
| 9,935,144 | B1 | 4/2018 | Lin et al. | |
| 2012/0037935 | A1* | 2/2012 | Yang | H01L 33/642 257/98 |
| 2012/0056217 | A1* | 3/2012 | Jung | H01L 33/48 257/89 |
| 2013/0062591 | A1* | 3/2013 | Jun | H01L 23/08 257/9 |
| 2013/0155390 | A1* | 6/2013 | Jensen | G01B 9/02051 356/72 |
| 2014/0264395 | A1* | 9/2014 | Lee | H01L 27/156 257/88 |

\* cited by examiner

*Primary Examiner* — Zandra V Smith
*Assistant Examiner* — John M Parker
(74) *Attorney, Agent, or Firm* — Muncy, Geissler. Olds & Lowe, P.C.

(57) ABSTRACT

A semiconductor device package includes a transparent substrate, a photo detector and a first conductive layer. The transparent substrate has a first surface and a first cavity underneath the first surface. The photo detector is disposed within the first cavity. The photo detector has a sensing area facing toward a bottom surface of the first cavity of the transparent substrate. The first conductive layer is disposed over the transparent substrate and electrically connected to the photo detector.

16 Claims, 55 Drawing Sheets

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly, to a semiconductor device package including an optical device and a method of manufacturing the same.

2. Description of the Related Art

Optical devices (such as image sensors) are widely used in many applications, such as digital cameras, cellular phones, security cameras, medical, automobile and the like. The technology used to manufacture optical devices has continued to advance at a great pace. For example, the demands of higher resolution and lower power consumption encourage the miniaturization and integration of optical devices and other electronic components to form a system in package (SiP).

In some existing semiconductor device package, to integrate optical devices and other electronic components into a package, the optical device and other electronic components may be arranged in a stacked structure. For example, the optical device may stack on other electronic components. However, the semiconductor device package with the stacked structure has relatively high manufacturing cost. Moreover, some issues (e.g. warpage, delamination or the like) may occur in the stacked structure, which would adversely affect performance or reliability of the semiconductor device package. Further, the semiconductor device package with the stacked structure has a relatively great size (thickness).

SUMMARY

In some embodiments, a semiconductor device package includes a transparent substrate, a photo detector and a first conductive layer. The transparent substrate has a first surface and a first cavity underneath the first surface. The photo detector is disposed within the first cavity. The photo detector has a sensing area facing toward a bottom surface of the first cavity of the transparent substrate. The first conductive layer is disposed over the transparent substrate and electrically connected to the photo detector.

In some embodiments, a method for manufacturing a semiconductor device package includes (a) providing a transparent substrate with a cavity; (b) disposing a photo detector within the cavity of the transparent substrate, the photo detector having a sensing area facing toward a bottom surface of the cavity of the transparent substrate; (c) forming a first passivation layer on the transparent substrate and within the cavity to cover at least a portion of the photo detector; and (d) forming a first conductive layer on the first passivation layer and electrically connected to the photo detector.

In some embodiments, a method for manufacturing a semiconductor device package includes (a) providing a transparent substrate with a cavity; (b) forming a first passivation layer on the transparent substrate and sidewall of the cavity; (c) forming a conductive layer on the first passivation layer and a portion of a bottom surface of the cavity; and (d) disposing a photo detector within the cavity of the transparent substrate and electrically connected to the conductive layer on the bottom surface of the cavity, the photo detector having a sensing area facing toward a bottom surface of the cavity of the transparent substrate

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

Figure 1:
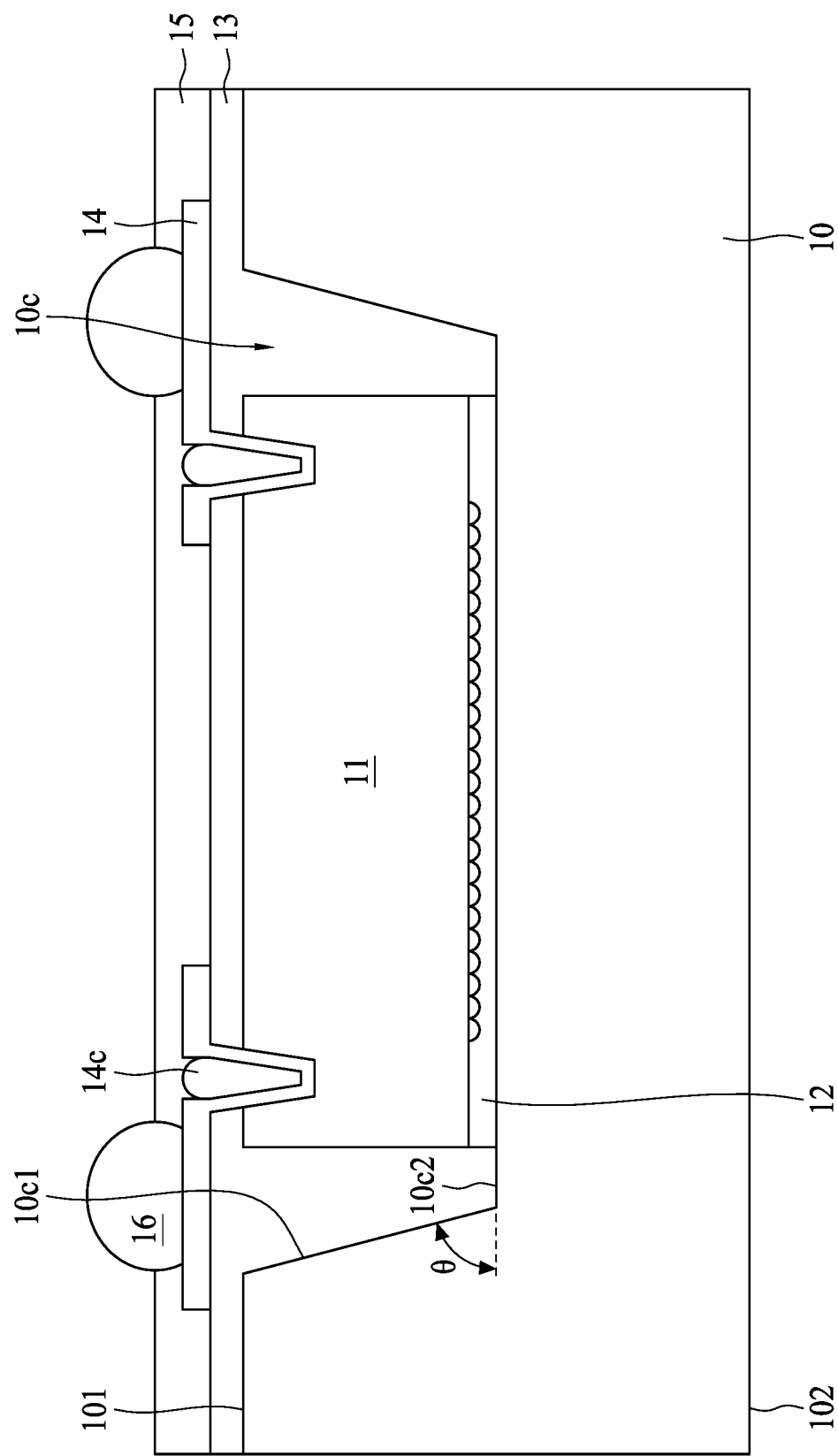
FIG. 1 illustrates a cross-sectional view of a semiconductor device package in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1 illustrates a cross-sectional view of a semiconductor device package 1 in accordance with some embodiments of the present disclosure. The semiconductor device package 1 includes a substrate 10, an optical device 11, a bonding layer 12, passivation layers 13 and 15, a conductive layer 14 and an electrical contact 16.

The substrate 10 has a surface 101 and a surface 102 opposite to the surface 101. In some embodiments, the surface 101 of the substrate 10 is referred to as a first surface and the surface 102 of the substrate 10 is referred to as a second surface. In some embodiments, the substrate 10 is light transparent. The material of the substrate 10 may be selected to allow the transmission of light emitted or received by the optical device 11. In some embodiments, the substrate 10 is a glass substrate.

The substrate 10 has or defines a cavity 10c extending from the surface 101 of the substrate 10 into the substrate 10. The cavity 10c of the substrate 10 is underneath the surface 101 of the substrate 10. The cavity 10c has a surface 10c2 (e.g., a bottom surface) and a surface 10c1 (e.g., a lateral surface or sidewall) connecting the surface 101 of the substrate 10 to the surface 10c2 of the cavity 10c. As shown in FIG. 1, the surface 10c1 and an extension surface of the surface 10c2 define an angle θ. In some embodiments, the angle θ is greater than 0 degree and equal to or less than 90 degrees.

The optical device 11 is disposed within the cavity 10c of the substrate 10. The optical device 11 is disposed on the surface 10c2 of the cavity 10c. In some embodiments, the optical device 11 is spaced apart from the surface 10c1 of the cavity 10c. The optical device 11 is or includes an image sensor or a light detector which may be, e.g., a PIN diode, a photodiode, or a phototransistor. The optical device 11 has a light receiving area (also referred to as an active surface) facing toward the surface 10c2 of the cavity 10c. The light receiving area of the optical device 11 is covered or encapsulated by the bonding layer 12. The material of the bonding layer 12 is selected to allow the transmission of light received by the optical device 11. In some embodiments, the bonding layer 12 includes an epoxy resin. In some embodiments, the bonding layer 12 may also include materials with high transmission and low stress to prevent a particle. In some embodiments, the bonding layer 12 includes microlens to increase optical performance. In other embodiments, the optical device 11 may be or include a light emitter or a light emitting device, such as a light-emitting diode (LED) or other light emitting die. For example, the optical device 11 may include, e.g., an LED, a laser diode, another device that may include one or more semiconductor layers, or a combination of two or more thereof.

The passivation layer 13 is disposed on the surface 101 of the substrate 10 and extends within the cavity 10c of the substrate 10 to cover or encapsulate the optical device 11. In some embodiments, the passivation layer 13 includes silicon oxide, silicon nitride, gallium oxide, aluminum oxide, scandium oxide, zirconium oxide, lanthanum oxide or hafnium oxide. In other embodiments, the passivation layer 13 can be replaced by a solder mask or a molding compound including epoxy without fillers.

The conductive layer 14 (or redistribution layer, RDL) is disposed on the passivation layer 13 and penetrates a portion of the passivation layer 13 to define a through via to electrically connect to the optical device 11. In some embodiments, the conductive layer 14 also extends from the backside surface of the optical device 11 into the optical device 11 to electrically connect to conductive contacts or terminals of the optical device 11. In some embodiments, the conductive layer 14 defines an aperture 14c (a hole or an opening) as shown in FIG. 1. The aperture 14c is at least partially surrounded by the passivation layer 13 and/or the optical device 11.

The passivation layer 15 is disposed on the passivation layer 13 to cover or encapsulate the passivation layer 13, the conductive layer 14 and the aperture 14c of the conductive layer 14. In some embodiments, the passivation layer 15 includes silicon oxide, silicon nitride, gallium oxide, aluminum oxide, scandium oxide, zirconium oxide, lanthanum oxide or hafnium oxide. In other embodiments, the passivation layer 15 can be replaced by a solder mask. In some embodiments, the passivation layer 15 and the passivation layer 13 are formed of the same material. Alternatively, the passivation layer 15 and the passivation layer 13 are formed of different same materials. The passivation layer 15 may include one or more openings to expose a portion of the conductive layer 14. The electrical contacts 16 (e.g., solder balls) are disposed on the exposed portion of the conductive layer 14 to provide electrical connections between the optical device 11 and other circuits, circuit boards or components.

Figure 2A:
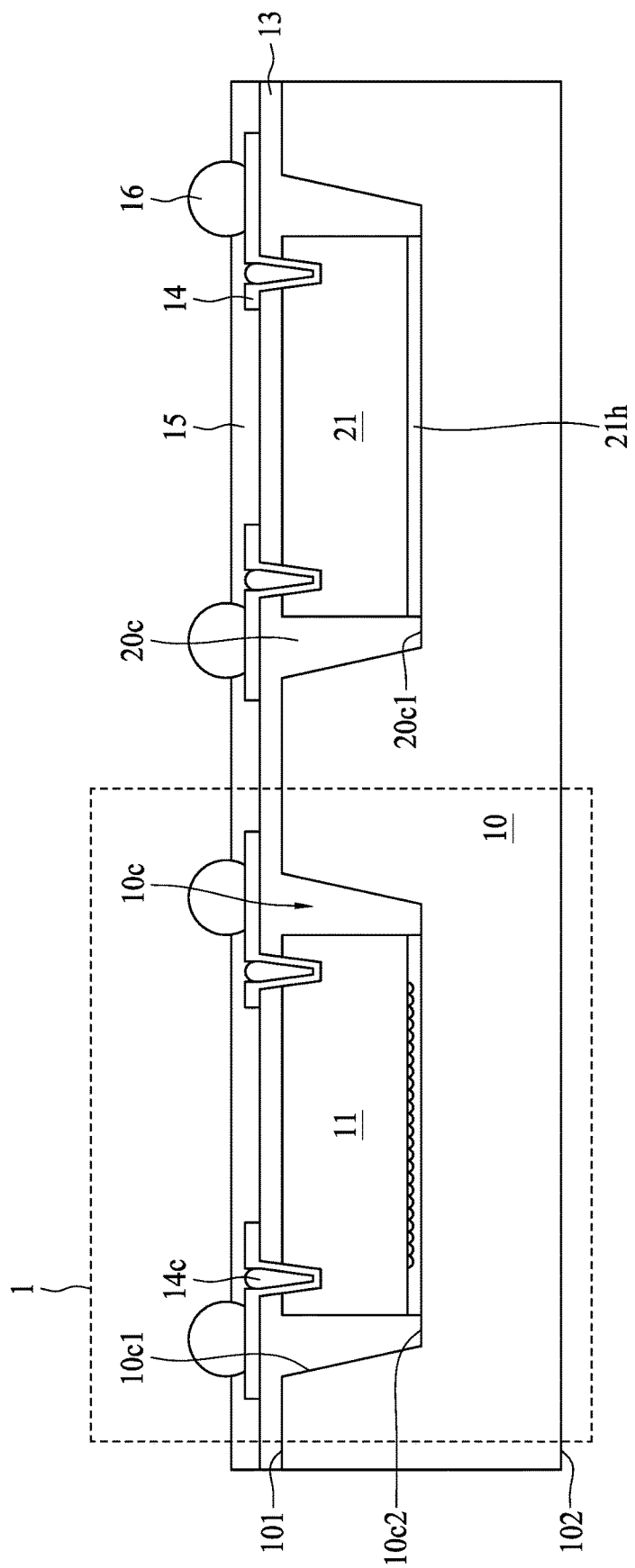
FIG. 2A illustrates a cross-sectional view of a semiconductor device package in accordance with some embodiments of the present disclosure.

In some embodiments, the optical device 11 illustrated in FIG. 1 can be integrated with other non-optical devices. For example, as shown in FIG. 2A, the optical device 11 and an electronic component 21 are integrated into a semiconductor device package 2. The substrate 10 includes another cavity 20c for accommodating the electronic component 21. The electronic component 21 is disposed within the cavity 20c of the substrate 10 and covered or encapsulated by the passivation layer 13. The electronic component 21 may be an active element, such as an IC chip or a die. Examples for the electronic component 21 may include a processor, a memory, a controller, a RF circuit or any other circuits. The electronic component 21 may be electrically connected to the optical device 11, other circuits or circuit boards through the conductive layer 14 and/or the electrical contacts 16. The electronic component 21 has a backside surface facing toward a surface 20c1 of the cavity 20c and is connected to the surface 20c1 through an adhesive layer 21h (e.g., tape or glue).

Figure 2C:
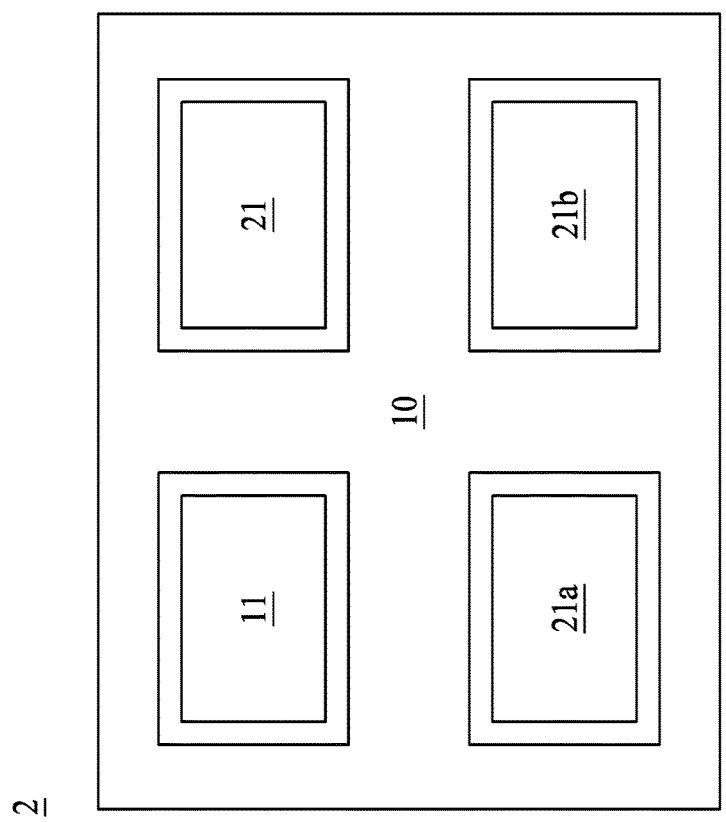
FIG. 2C illustrates a top view of a semiconductor device package in accordance with some embodiments of the present disclosure.
Figure 2B:
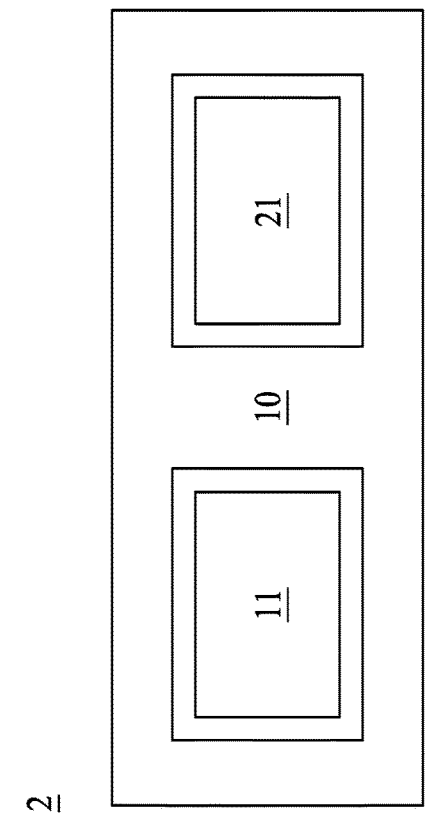
FIG. 2B illustrates a top view of a semiconductor device package in accordance with some embodiments of the present disclosure.

In some existing semiconductor device packages, to integrate optical devices and other electronic components into a package, the optical device and other electronic components may be arranged in a stacked structure. However, the semiconductor device package with the stacked structure has relatively high manufacturing costs. In accordance with the embodiments in FIG. 2A of the present disclosure, the optical device 11 and the electronic component 21 are embedded within the substrate 10 and arranged side-by-side, which would reduce the manufacturing costs and the thickness of the semiconductor device package. In addition, due to the limitations of the process for the stacked package, the number of the stacked layers is limited, which hinders the integration of optical devices and other electronic components. As shown in FIG. 2B and FIG. 2C, which illustrate top views of the semiconductor device package 2 in FIG. 2A according to different embodiments, since the optical device 11 and other electronic components 21, 21a and/or 21b are embedded within the substrate 10 and arranged side-by-side, it would be easier to integrate the optical device 11 with required electronic components into a single package, leading to increased flexibility for designing the semiconductor device package 2.

Moreover, since the optical device 11 and the electronic components 21, 21a and/or 21b are embedded within the substrate 10, a molding compound for protecting the optical device 11 and the electronic components 21, 21a and/or 21b can be omitted, which would eliminate the warpage issues, delamination issues or the like due to coefficient of thermal expansion (CTE) mismatch between different materials. Furthermore, disposing the optical device 11 and the electronic components 21, 21a and/or 21b within the glass substrate can improve the heat dissipation compared with the use of the molding compound.

Figure 3:
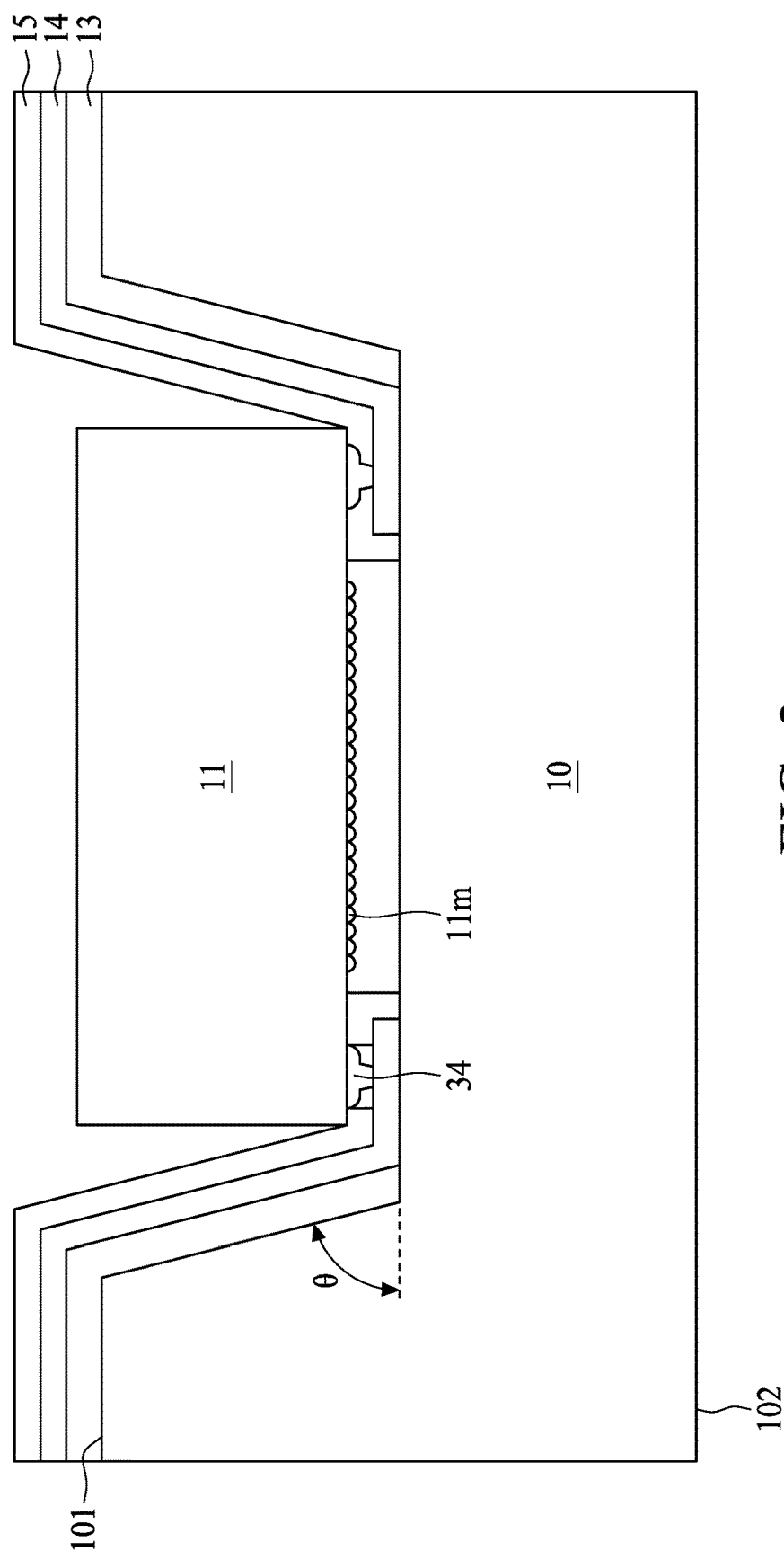
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 in FIG. 3 is similar to the semiconductor device package 1 in FIG. 1, and the differences therebetween are described below.

The passivation layer 13 is disposed on the surface 101 of the substrate 10 and extends on the surface 10c1 of the cavity 10c. The passivation layer 13 does not cover the optical device 11. In other words, the optical device 11 is exposed from the passivation layer 13. The conductive layer 14 is disposed on the passivation layer 13 and further extends on the surface 10c2 of the cavity 10c. The passivation layer 15 is disposed on the conductive layer 14 and exposes a portion of the conductive layer 14.

The optical device 11 disposed within the cavity 10c of the substrate 10 and electrically connected to the exposed portion of the conductive layer 14 through electrical contacts 34. In some embodiments, the electrical contacts 34 may be or include conductive pillars, solder balls, stub bumps or other suitable electrical contacts. The optical device 11 has a light receiving area facing toward the surface 10c2 of the cavity 10c. In some embodiments, the microlens 11m may be disposed on the light receiving area of the optical device 11.

Figure 4:
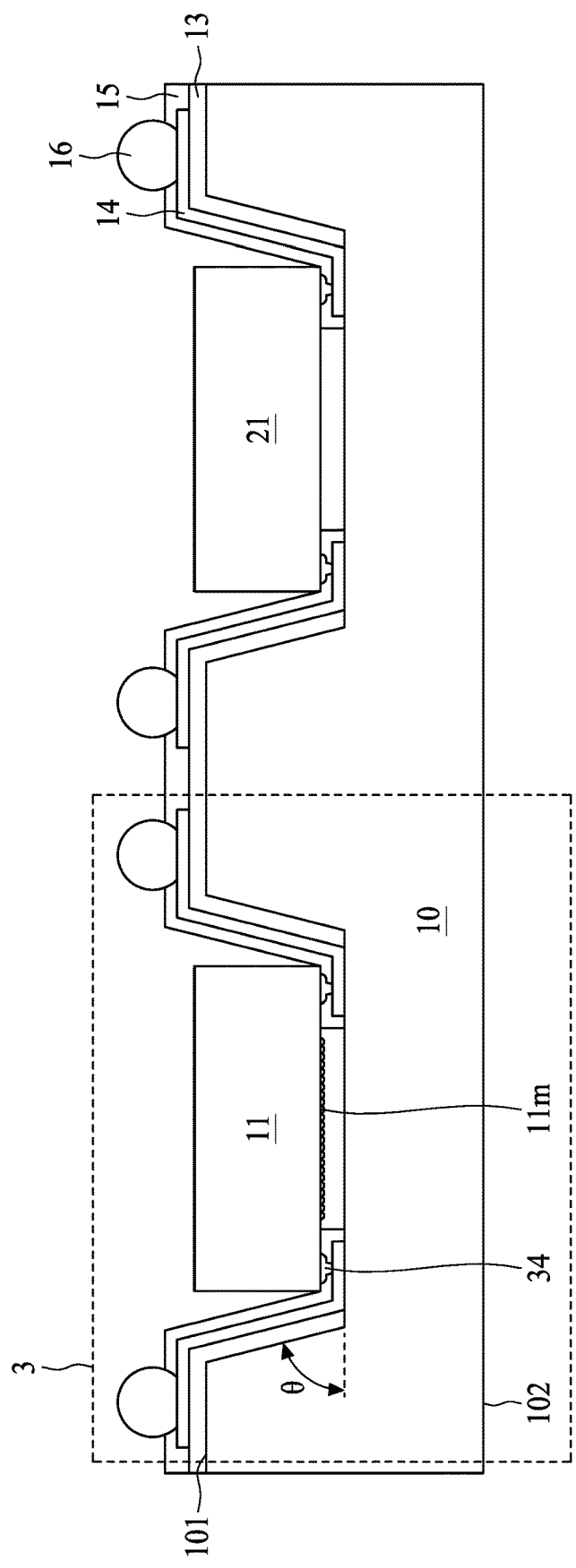
FIG. 4 illustrates a cross-sectional view of a semiconductor device package in accordance with some embodiments of the present disclosure.

As shown in the semiconductor device package 1 of FIG. 1, the optical device 11 is connected to the conductive layer 14 on the substrate 10 by the through via that penetrates the passivation layer 13. Compared with the semiconductor device package 1, the optical device 11 of the semiconductor device package 3 is connected to the conductive layer 14 through an electrical contact 34, which would further simplify the manufacturing process and cost. In some embodiments, the optical device 11 in FIG. 3 also can be integrated with other electronic components 21 as shown in FIG. 4. As shown in FIG. 4, the optical device 11 and the electronic component 21 are also arranged side-by-side, and thus the effects or advantages of the semiconductor device package 2A can be applicable to the semiconductor device package 4 in FIG. 4.

Figure 5:
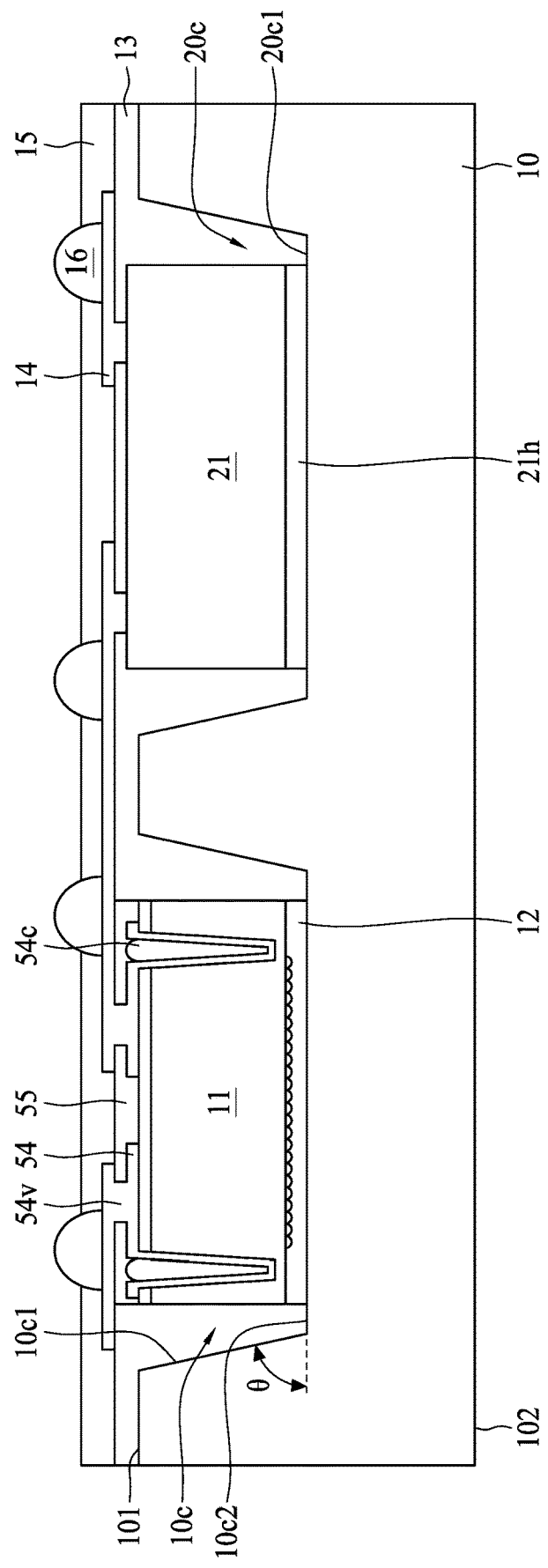
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 in FIG. 5 is similar to the semiconductor device package 2 in FIG. 2A, and the differences therebetween are described below.

The semiconductor device package 5 further includes a passivation layer 55 disposed on the backside surface of the optical device 11. For example, the backside surface of the optical device 11 of the semiconductor device package 5 is covered by the passivation layer 55 rather than the passivation layer 13 as shown in FIG. 2A. A conductive layer 54 is disposed on the backside surface of the optical device 11 and penetrates the optical device 11 to be electrically connected to the electrical contacts or terminals of the optical device 11. The conductive layer 54 is electrically connected to the conductive layer 14 disposed on the passivation layer 13 and the passivation layer 55 through a conductive via 54v. In some embodiments, the conductive layer 54 defines an aperture 54c (a hole or an opening). The aperture 54c is at least partially surrounded by the passivation layer 55 and/or the optical device 11. In some embodiments, the number of layers of the conductive layer and/or the passivation layer can be changed depending on different design specifications. For example, there may be N conductive layers covered by the passivation layer, where N is an integer equal to or greater than 1. As shown in FIG. 5, the optical device 11 and the electronic component 21 are also arranged side-by-side, and thus the effects or advantages of the semiconductor device package 2A can be applicable to the semiconductor device package 5 in FIG. 5.

Figure 6:
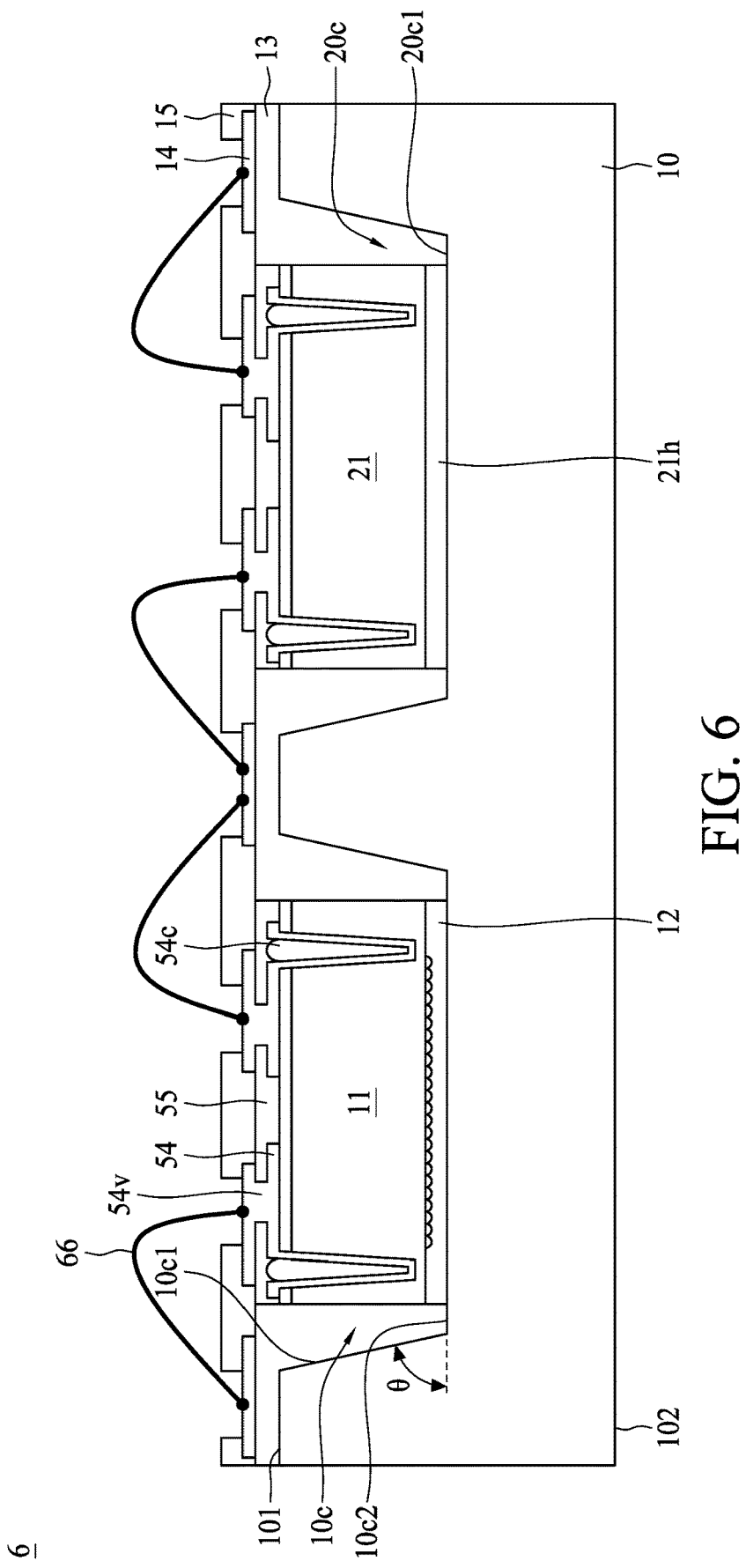
FIG. 6 illustrates a cross-sectional view of a semiconductor device package in accordance with some embodiments of the present disclosure.

FIG. 6 illustrates a cross-sectional view of a semiconductor device package 6 in accordance with some embodiments of the present disclosure. The semiconductor device package 6 in FIG. 6 is similar to the semiconductor device package 5 in FIG. 5, and one of the differences therebetween is that the semiconductor device package 5 provides electrical connections for the optical device 11 and the electronic component 21 by solder balls 16 while the semiconductor device package 6 provides electrical connections for the optical device 11 and the electronic component 21 by bonding wires 66. In some embodiments, the number of layers of the conductive layer and/or the passivation layer can be changed depending on different design specifications. For example, there may be N conductive layers covered by the passivation layer, where N is an integer equal to or greater than 1. As shown in FIG. 6, the optical device 11 and the electronic component 21 are also arranged side-by-side, and thus the effects or advantages of the semiconductor device package 2A can be applicable to the semiconductor device package 6 in FIG. 6.

FIGS. 7A, 7B, 7C, 7D, 7E, and 7F illustrate various stages of a semiconductor package manufacturing process, according to some embodiments of the present disclosure. In some embodiments, the operations illustrated in FIGS. 7A, 7B, 7C, 7D, 7E, and 7F are used to manufacturing the semiconductor device package 2 in FIG. 2A. Alternatively, the operations illustrated in FIGS. 7A, 7B, 7C, 7D, 7E, and 7F can be used to manufacturing other semiconductor device packages.

Figure 7A:
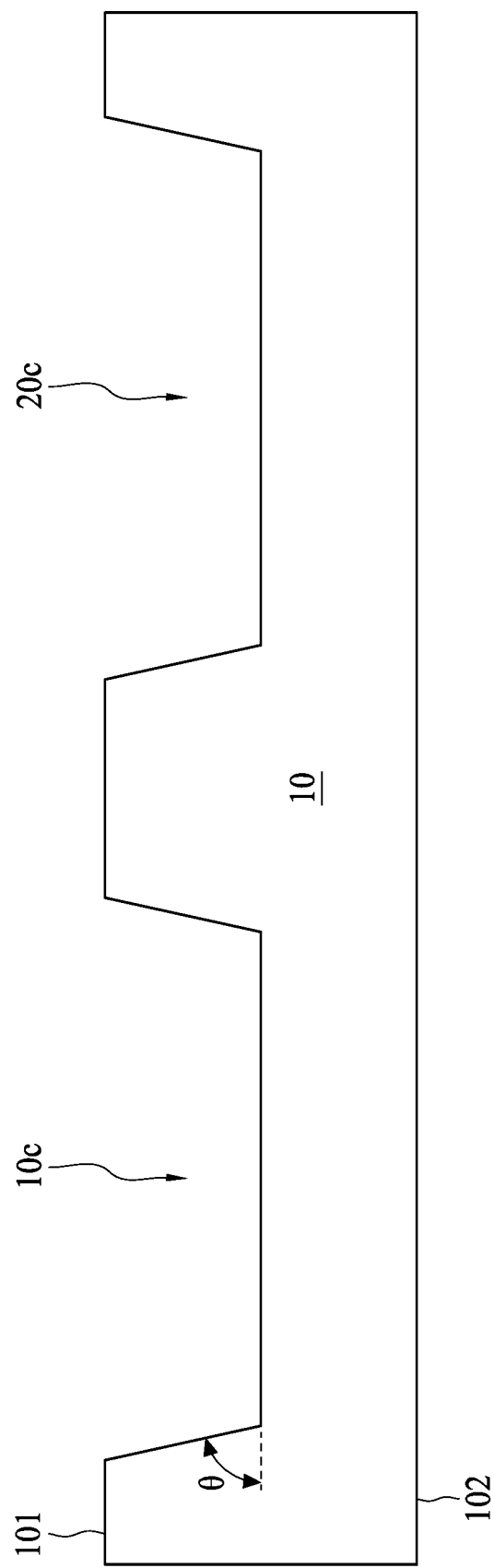
FIGS. 7A, 7B, 7C, 7D, 7E and 7F illustrate multiple stages of a semiconductor package manufacturing process, according to some embodiments of the present disclosure.

Referring to FIG. 7A, a substrate strip including the substrate 10 is provided. In some embodiments, the substrate 10 is light transparent substrate, such as a glass substrate. Cavities 10c and 20c are then formed from the surface 101 of the substrate 10 into the substrate 10. The cavities 10c and 20c are separated from each other. In some embodiments, the angle θ defined by the surface 10c1 and an extension surface of the surface 10c2 is greater than 0 degree and equal to or less than 90 degrees.

Figure 7B:
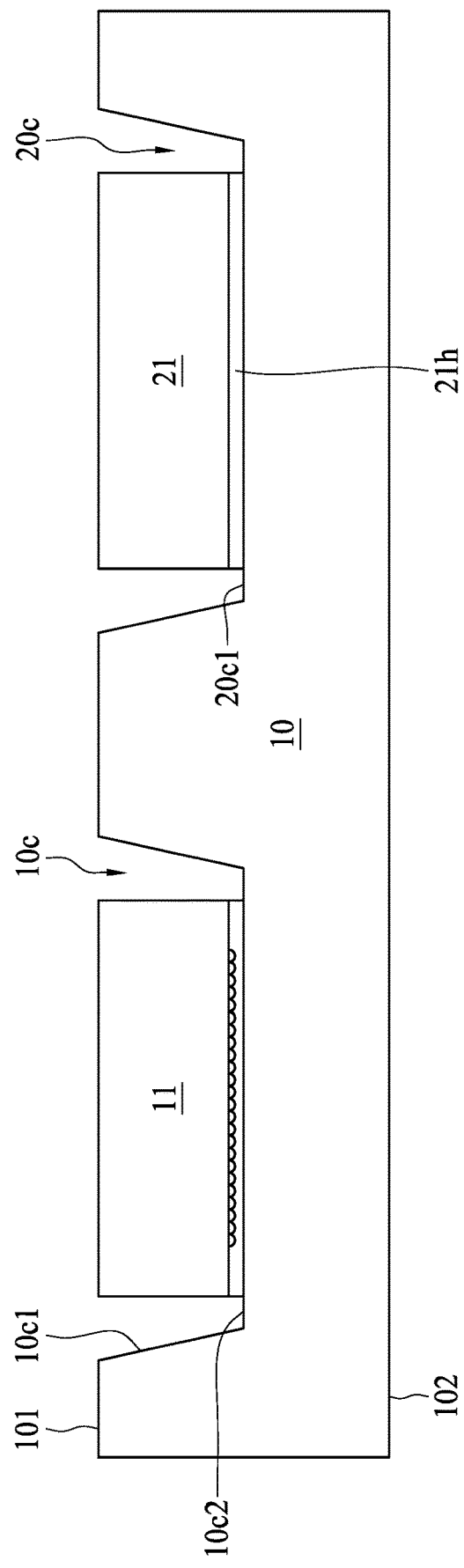

Referring to FIG. 7B, the optical device 11 is disposed within the cavity 10c and the electronic component 21 is disposed within the cavity 20c. In some embodiments, the optical device 11 and the electronic component 21 are disposed within the cavities 10c and 20c by, for example, pick-and-place or other suitable techniques. The optical device 11 and the electronic component 21 are respectively bonded to the surfaces 10c2 and 20c1 of the cavities 10c and 20c through the bonding layer (or the adhesive layer).

Figure 7C:
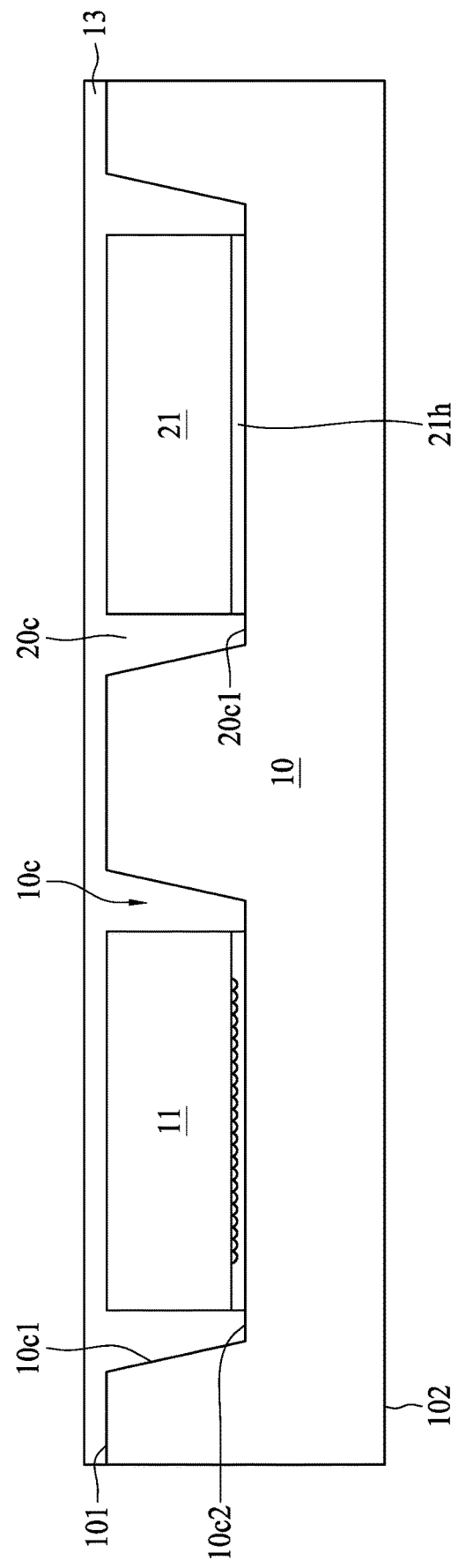

Referring to FIG. 7C, the passivation layer 13 is formed on the surface 101 of the substrate 10 and the cavities 10c, 20c to cover or encapsulate the optical device 11 and the electronic component 21. In some embodiments, the passivation layer 13 can be formed by, for example, coating, molding, printing or any other suitable technique(s).

Figure 7D:
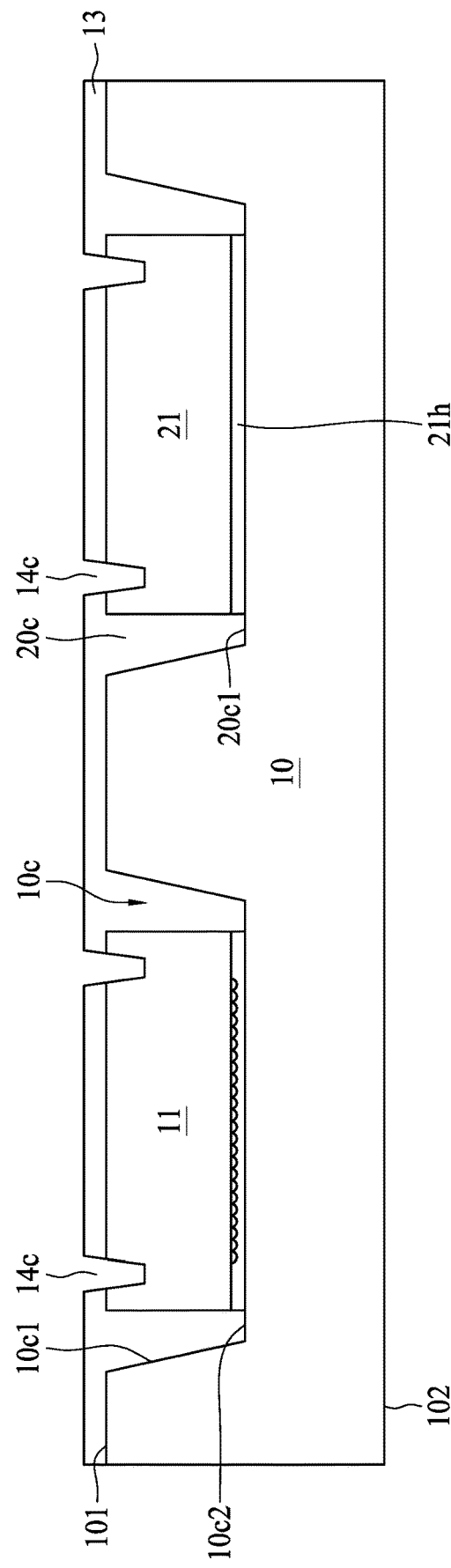

Referring to FIG. 7D, a plurality of openings 14c are formed to penetrate a portion of the passivation layer 13. The openings 14c are also formed to penetrate a portion of the optical device 11 and the electronic component 21 to expose electrical contacts or terminals thereof. In some embodiments, the openings 14c can be formed by, for example, etching, drilling, laser drilling or any other suitable technique(s).

Figure 7E:
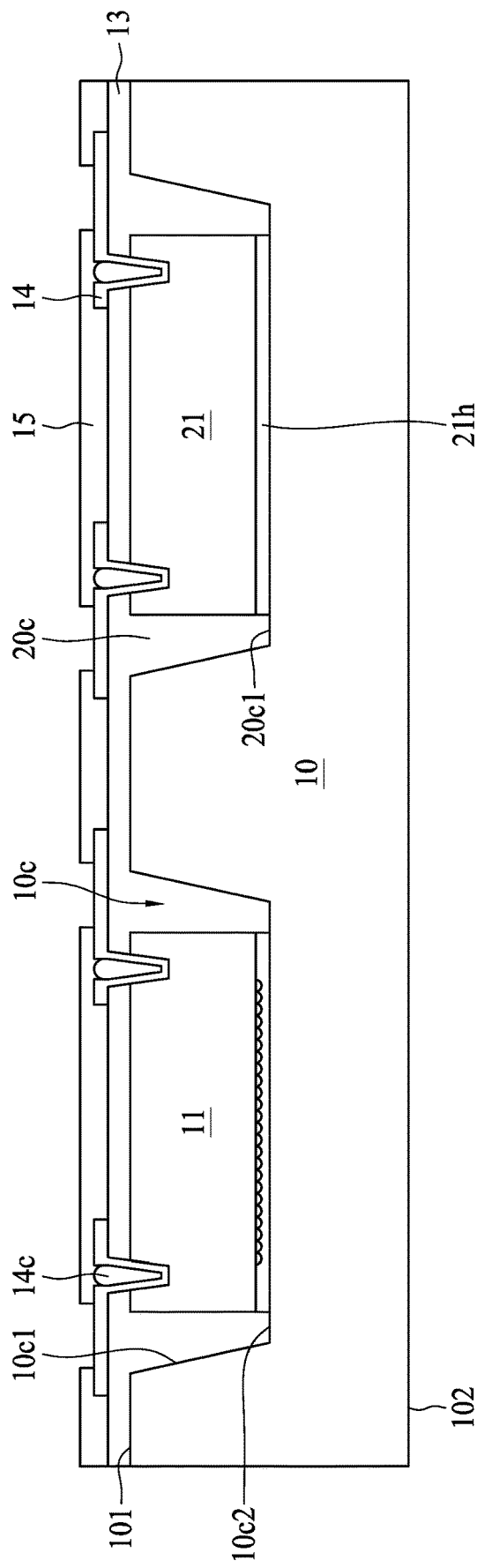

Referring to FIG. 7E, the conductive layer 14 (e.g., RDL) is formed on the passivation layer 13 and extends within the openings 14c to be electrically connected to the exposed portion of the electrical contacts or terminals of the optical device 11 and the electronic component 21. The passivation layer 15 is formed on the passivation layer 13 to cover or encapsulate the passivation layer 13, the conductive layer 14 and the openings 14c. One or more openings are then formed to expose a portion of the conductive layer 14.

Figure 7F:
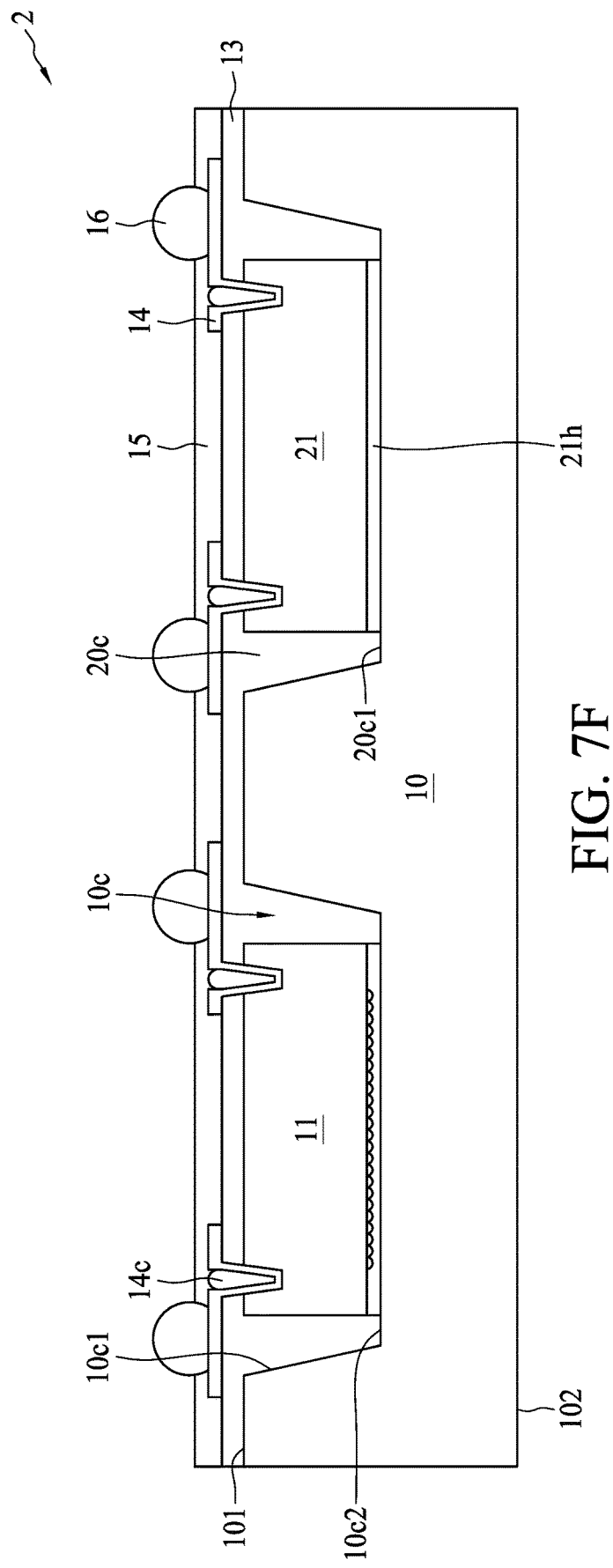

Referring to FIG. 7F, the electrical contacts 16 (e.g., solder balls) are disposed on the exposed portion of the conductive layer 14 to provide electrical connections between the optical device 11 or the electronic component 21 and other circuits, circuit boards or components. Then, a singulation may be performed to separate out individual semiconductor device packages including the semiconductor device package 2. The singulation may be performed, for example, by using a dicing saw, laser or other appropriate cutting technique.

FIGS. 8A, 8B, 8C, 8D and 8E illustrate various stages of a semiconductor package manufacturing process, according to some embodiments of the present disclosure. In some embodiments, the operations illustrated in FIGS. 8A, 8B, 8C, 8D and 8E are used to manufacturing the semiconductor device package 4 in FIG. 4. Alternatively, the operations illustrated in FIGS. 8A, 8B, 8C, 8D and 8E can be used to manufacturing other semiconductor device packages.

Figure 8A:
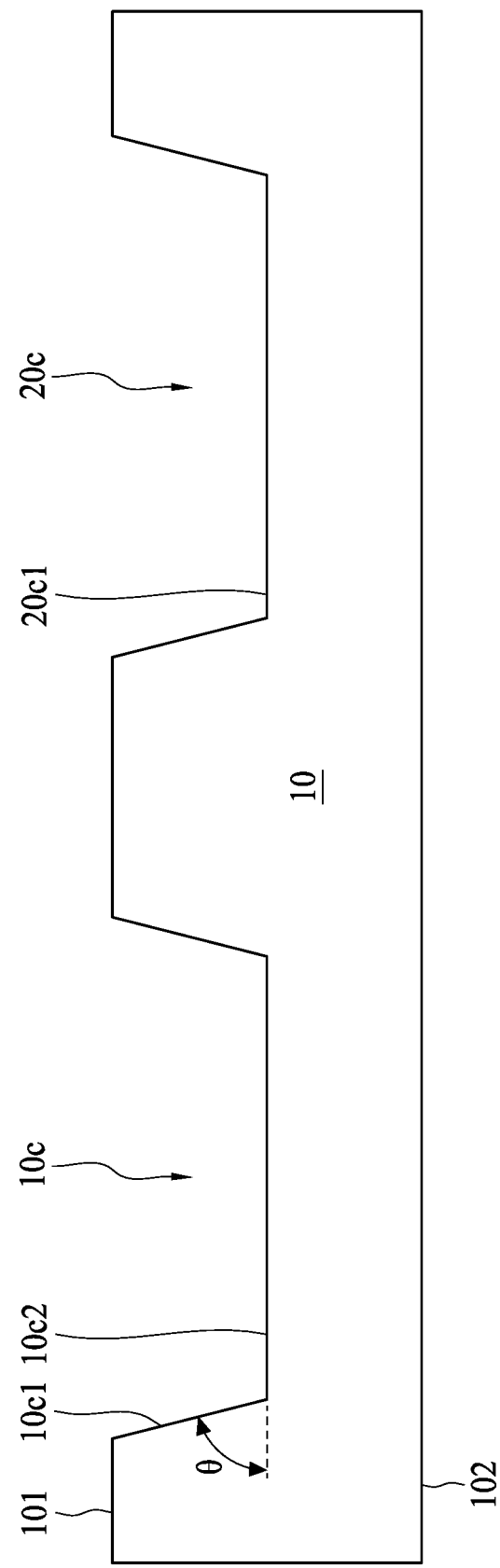
FIGS. 8A, 8B, 8C, 8D and 8E illustrate multiple stages of a semiconductor package manufacturing process, according to some embodiments of the present disclosure.

Referring to FIG. 8A, a substrate strip including the substrate 10 is provided. In some embodiments, the substrate 10 is light transparent substrate, such as a glass substrate. Cavities 10c and 20c are then formed from the surface 101 of the substrate 10 into the substrate 10. The cavities 10c and 20c are separated from each other. In some embodiments, the angle θ defined by the surface 10c1 and an extension surface of the surface 10c2 is greater than 0 degree and equal to or less than 90 degrees.

Figure 8B:
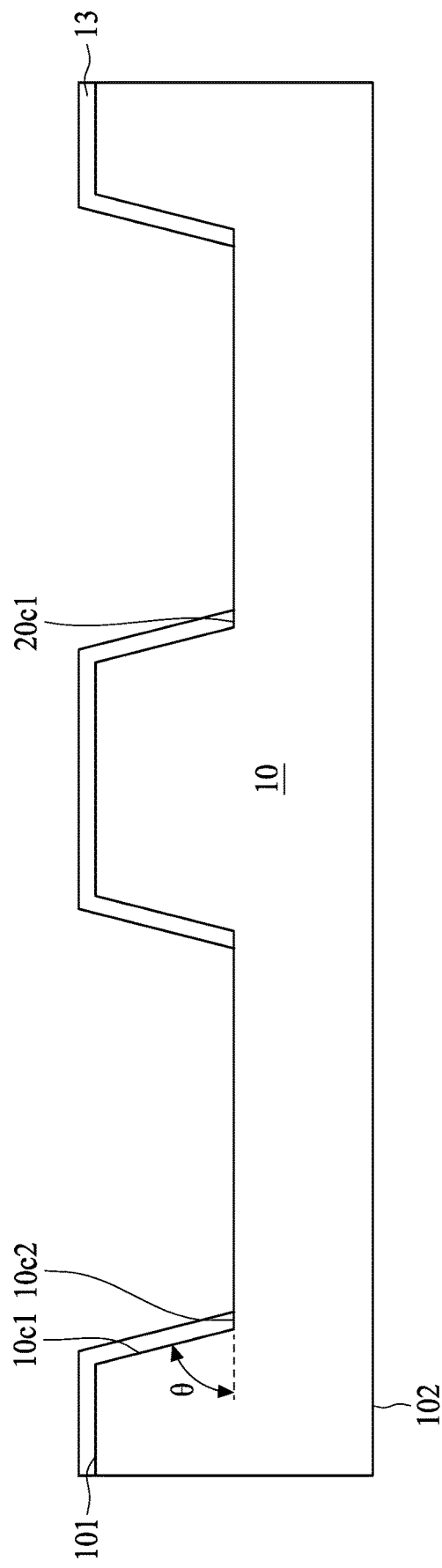

Referring to FIG. 8B, the passivation layer 13 is formed on the surface 101 of the substrate 10 and the surface 10c1 of the cavities 10c, 20c. In some embodiments, the passivation layer 13 can be formed by, for example, coating, molding, printing or any other suitable technique(s).

Figure 8C:
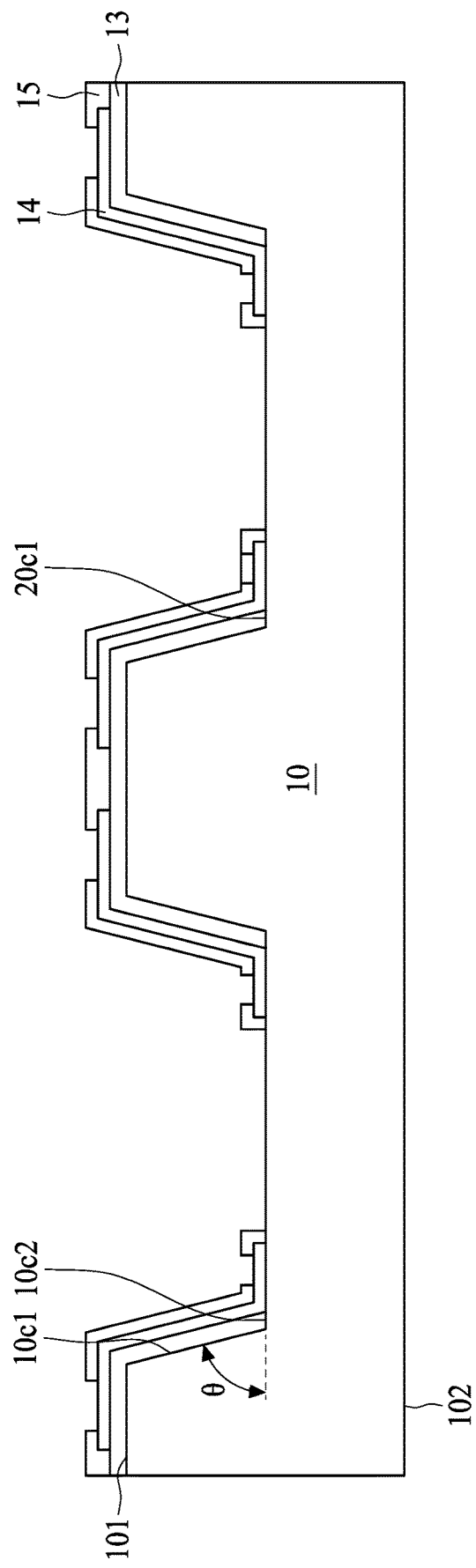

Referring to FIG. 8C, the conductive layer 14 (e.g., RDL) is formed on the passivation layer 13 and further extends on the surfaces 10c2, 20c1 of the cavities 10c, 20c. The passivation layer 15 is formed on the conductive layer 14. One or more openings are then formed to expose a portion of the conductive layer 14.

Figure 8D:
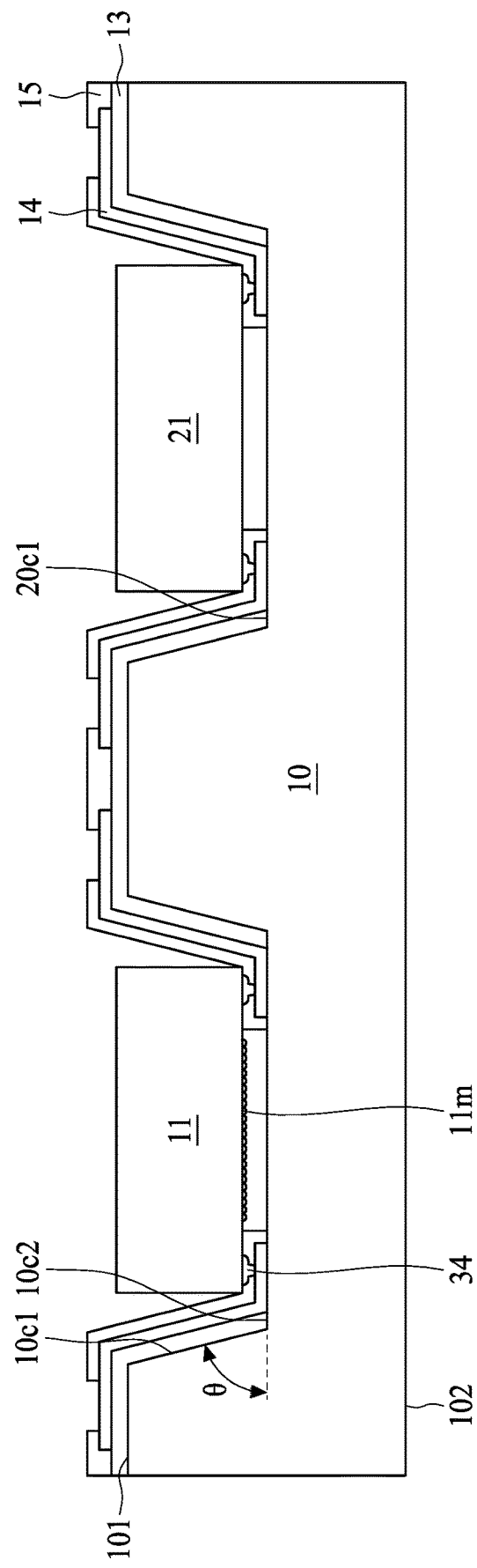

Referring to FIG. 8D, the optical device 11 is disposed within the cavity 10c and the electronic component 21 is disposed within the cavity 20c. In some embodiments, the optical device 11 and the electronic component 21 are disposed within the cavities 10c and 20c by, for example, pick-and-place or other suitable techniques. The optical device 11 and the electronic component 21 are respectively connected to the exposed portions of the conductive layer 14 through the electrical contacts 34 (e.g., conductive pillars, solder balls or stub bumps).

Figure 8E:
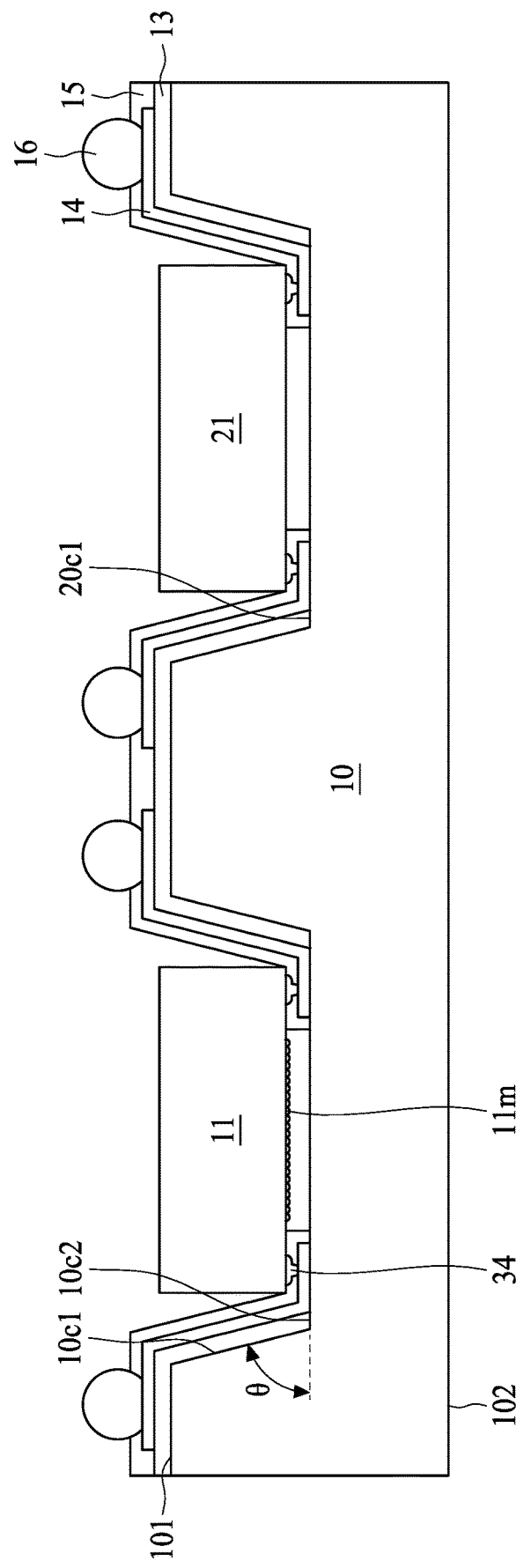

Referring to FIG. 8E, the electrical contacts 16 (e.g., solder balls) are disposed on the exposed portion of the conductive layer 14 to provide electrical connections between the optical device 11 or the electronic component 21 and other circuits, circuit boards or components. Then, a singulation may be performed to separate out individual semiconductor device packages including the semiconductor device package 4. The singulation may be performed, for example, by using a dicing saw, laser or other appropriate cutting technique.

Figure 9A:
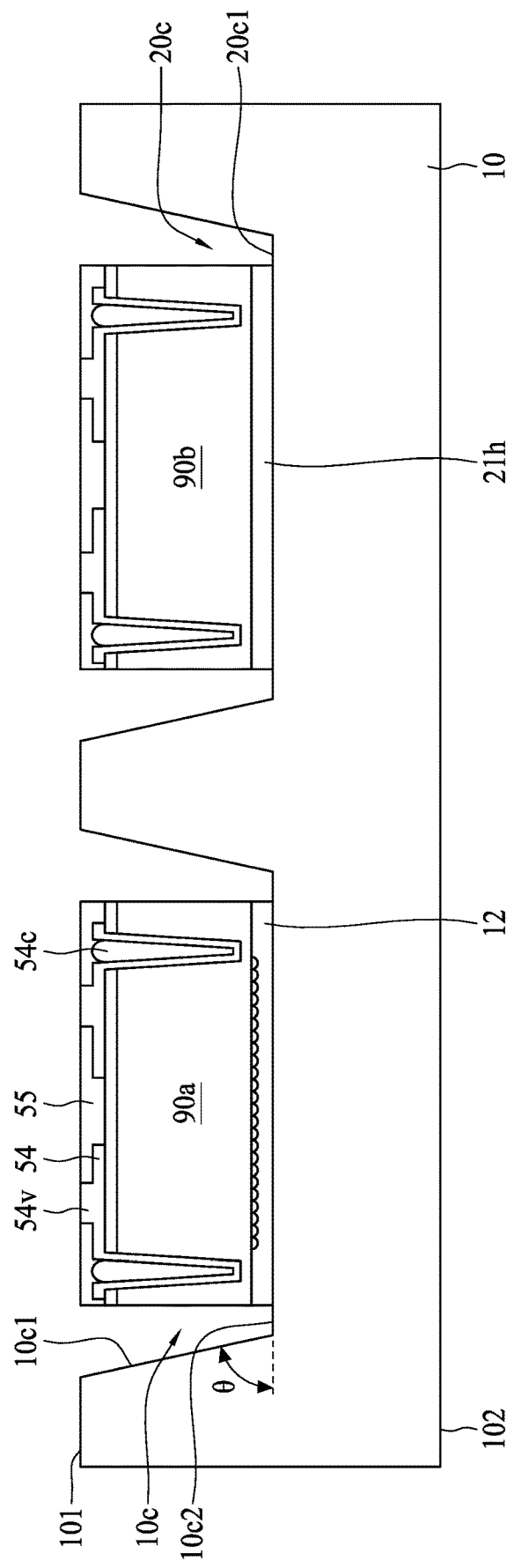
FIGS. 9A, 9B, 9C, 9D and 9E illustrate multiple stages of a semiconductor package manufacturing process, according to some embodiments of the present disclosure.

FIGS. 9A, 9B, 9C, 9D and 9E illustrate various stages of a semiconductor package manufacturing process, according to some embodiments of the present disclosure. In some embodiments, the operations illustrated in FIGS. 9A, 9B, 9C, 9D and 9E are used to manufacturing the semiconductor device package 5 or 6 in FIG. 5 or FIG. 6. Alternatively, the operations illustrated in FIGS. 9A, 9B, 9C, 9D and 9E can be used to manufacturing other semiconductor device packages. In some embodiments, the operation in FIG. 9A is carried out subsequent to the operation in FIG. 7A (i.e., the formation of the cavities 10c, 20c).

Referring to FIG. 9A, an optical module 90a and an electronic module 90b are respectively disposed within the cavities 10c and 20c. The optical module 90a is similar to the optical device 11 except that the optical module 90a further includes a conductive layer 54 and a passivation layer 55. The conductive layer 54 is disposed on the backside surface of the optical device and penetrates the optical device to be electrically connected to the electrical contacts or terminals of the optical device. The passivation layer 55 is disposed on the backside surface of the optical device to cover a portion of the conductive layer 54 and expose another portion of the conductive layer 54. Similarly, the electronic module 90b is similar to the electronic component 21 except that the optical module 90a further includes a conductive layer and a passivation layer. The optical module 90a and the electronic module 90b are respectively bonded to the surfaces 10c2 and 20c1 of the cavities 10c and 20c through the bonding layer (or the adhesive layer).

Figure 9B:
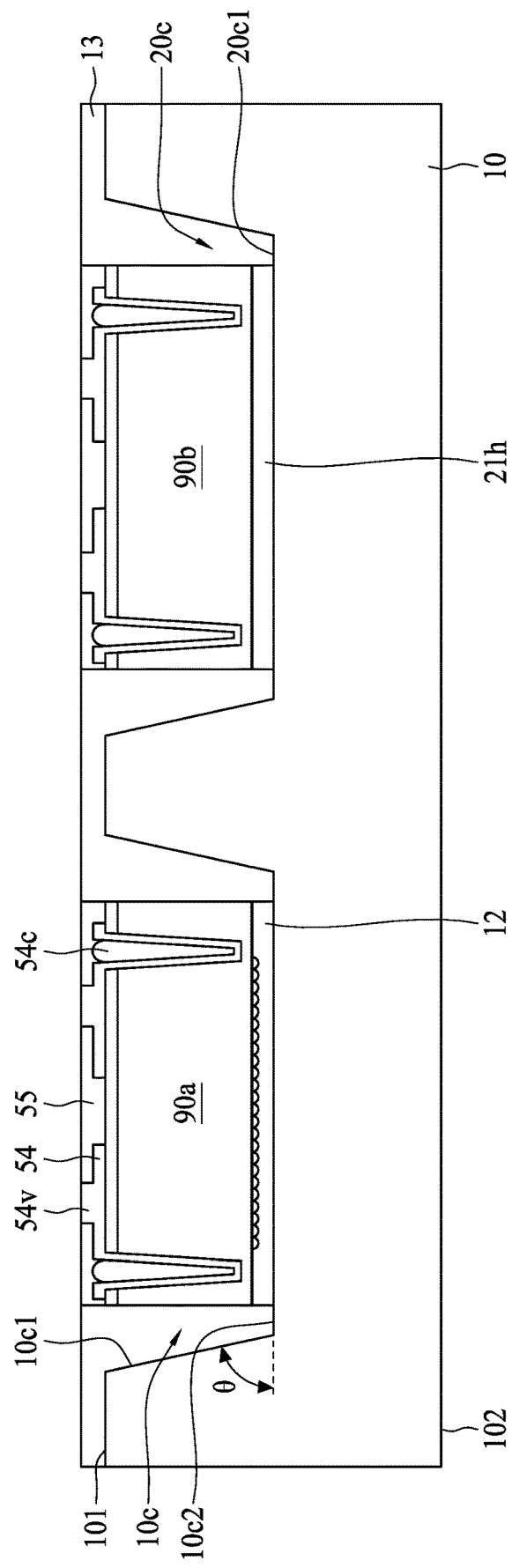

Referring to FIG. 9B, the passivation layer 13 is formed on the surface 101 of the substrate 10 and the cavities 10c, 20c to cover or encapsulate the optical module 90a and the electronic module 90b. The top portion of the optical module 90a and the electronic module 90b are exposed from the passivation layer 13. In some embodiments, the passivation layer 13 can be formed by, for example, coating, molding, printing or any other suitable technique(s).

Figure 9C:
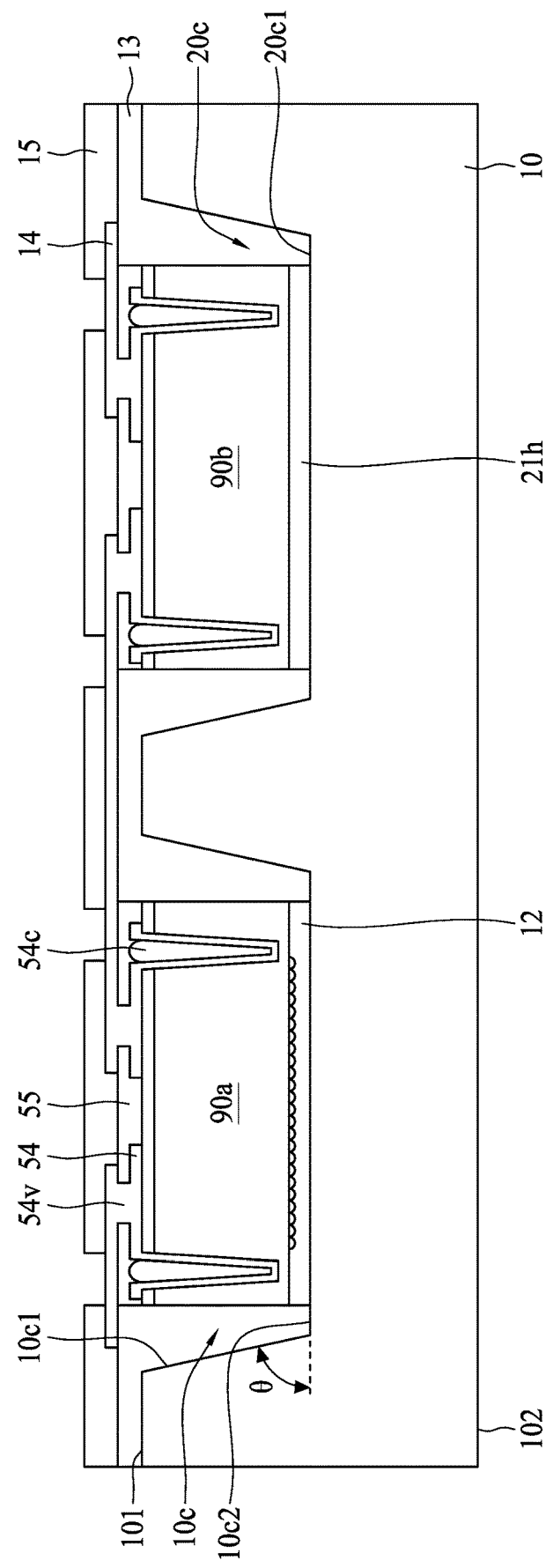

Referring to FIG. 9C, the conductive layer 14 (e.g., RDL) is formed on the passivation layer 13, the optical module 90a and the electronic module 90b to be electrically connected to the exposed portion of the conductive layer 54 of the optical module 90a and the electronic module 90b. The passivation layer 15 is formed on the passivation layer 13 to cover or encapsulate the passivation layer 13 and the conductive layer 14. One or more openings are then formed to expose a portion of the conductive layer 14.

Figure 9D:
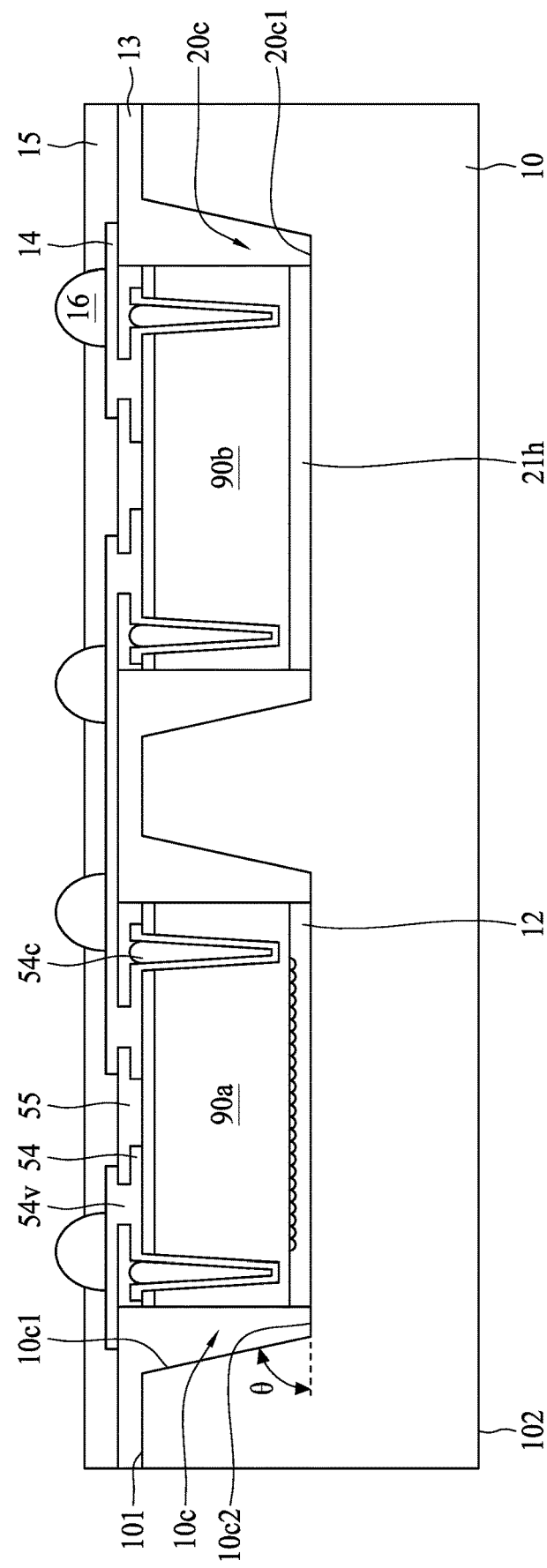

Referring to FIG. 9D, the electrical contacts 16 (e.g., solder balls) are disposed on the exposed portion of the conductive layer 14 to provide electrical connections between the optical module 90a or the electronic module 90b and other circuits, circuit boards or components. Then, a singulation may be performed to separate out individual semiconductor device packages including the semiconductor device package 5. The singulation may be performed, for example, by using a dicing saw, laser or other appropriate cutting technique.

Figure 9E:
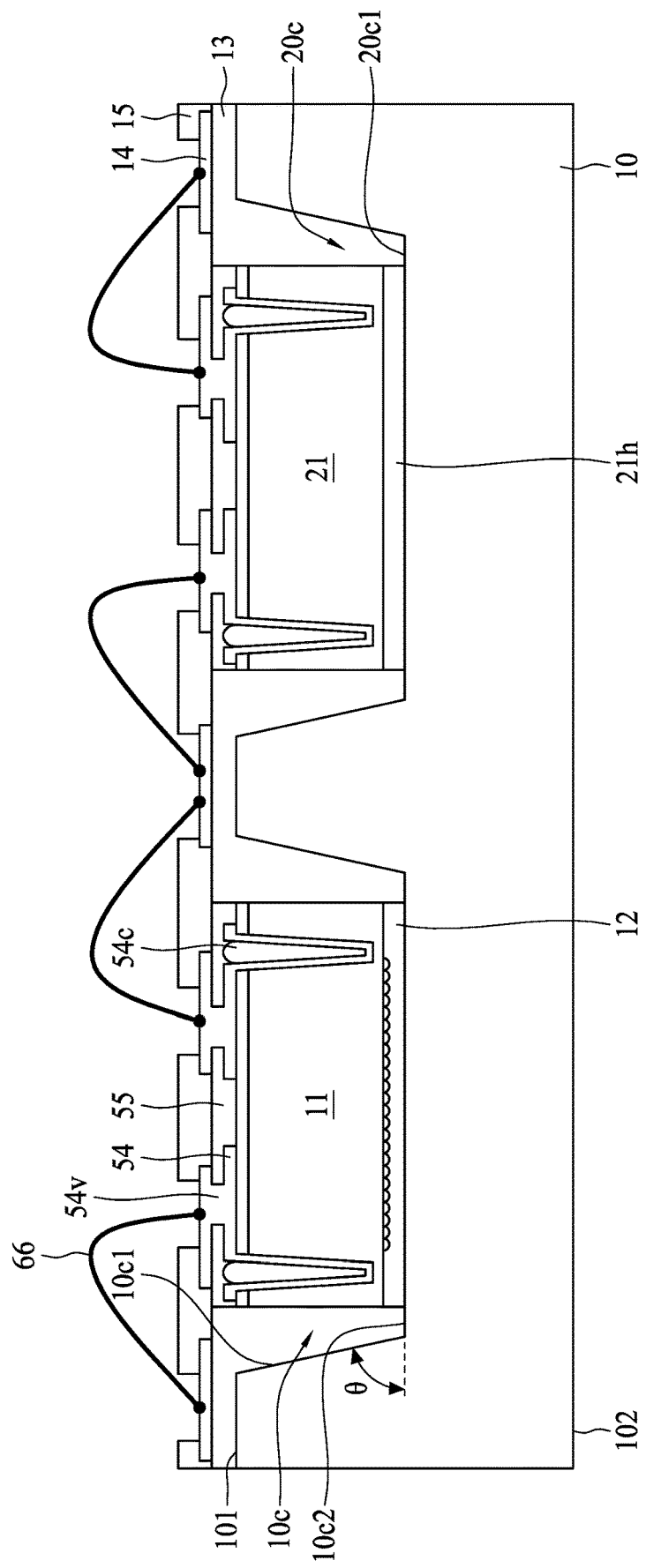

The operation in FIG. 9E is carried out subsequent to the operation in FIG. 9C, the bonding wires 66 are formed on the exposed portion of the conductive layer 14 to provide electrical connections between the optical module 90a or the electronic module 90b and other circuits, circuit boards or components. Then, a singulation may be performed to separate out individual semiconductor device packages including the semiconductor device package 6. The singulation may be performed, for example, by using a dicing saw, laser or other appropriate cutting technique.

Figure 10A:
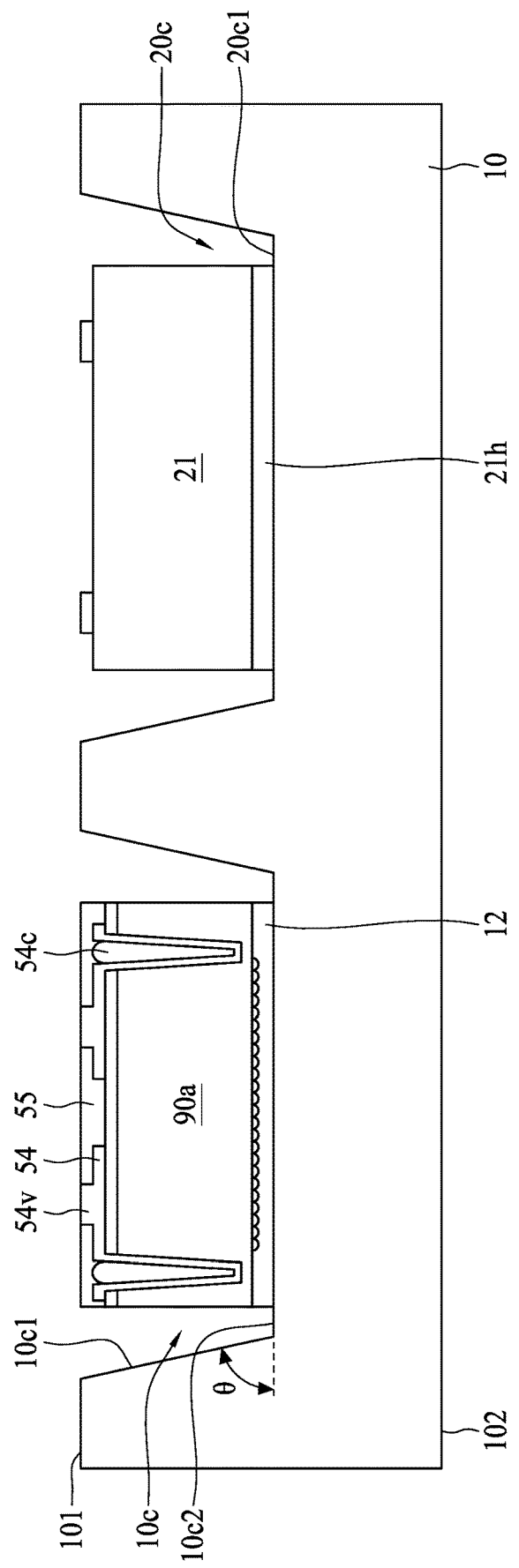
FIGS. 10A, 10B, 10C, 10D and 10E illustrate multiple stages of a semiconductor package manufacturing process, according to some embodiments of the present disclosure.

FIGS. 10A, 10B, 10C, 10D and 10E illustrate various stages of a semiconductor package manufacturing process, according to some embodiments of the present disclosure. In some embodiments, the operation in FIG. 10A is carried out subsequent to the operation in FIG. 7A (i.e., the formation of the cavities 10c, 20c).

Referring to FIG. 10A, the optical module 90a and the electronic component 21 are respectively disposed within the cavities 10c and 20c. The optical module 90a is similar to the optical device 11 except that the optical module 90a further includes a conductive layer 54 and a passivation layer 55. The conductive layer 54 is disposed on the backside surface of the optical device and penetrates the optical device to be electrically connected to the electrical contacts or terminals of the optical device. The passivation layer 55 is disposed on the backside surface of the optical device to cover a portion of the conductive layer 54 and expose another portion of the conductive layer 54. The optical module 90a and the electronic component 21 are respectively bonded to the surfaces 10c2 and 20c1 of the cavities 10c and 20c through the bonding layer (or the adhesive layer).

Figure 10B:
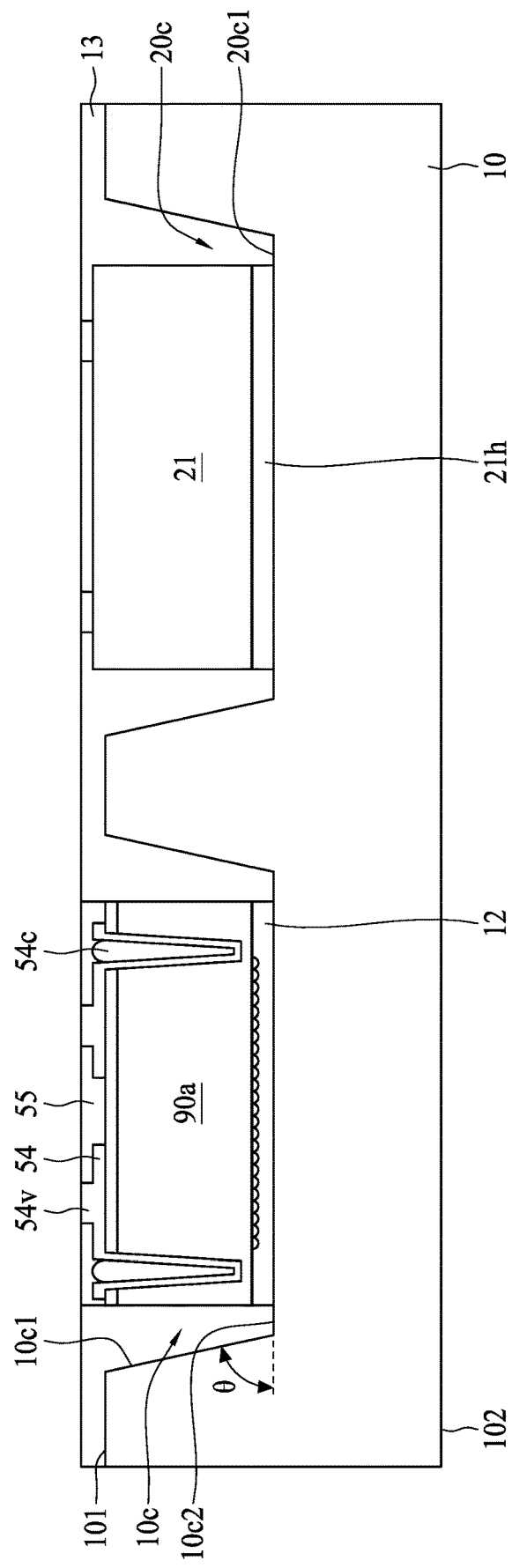

Referring to FIG. 10B, the passivation layer 13 is formed on the surface 101 of the substrate 10 and the cavities 10c, 20c to cover or encapsulate the optical module 90a and the electronic component 21. The top portion of the optical module 90a and electrical contacts of the electronic component 21 are exposed from the passivation layer 13. In some embodiments, the passivation layer 13 can be formed by, for example, coating, molding, printing or any other suitable technique(s).

Figure 10C:
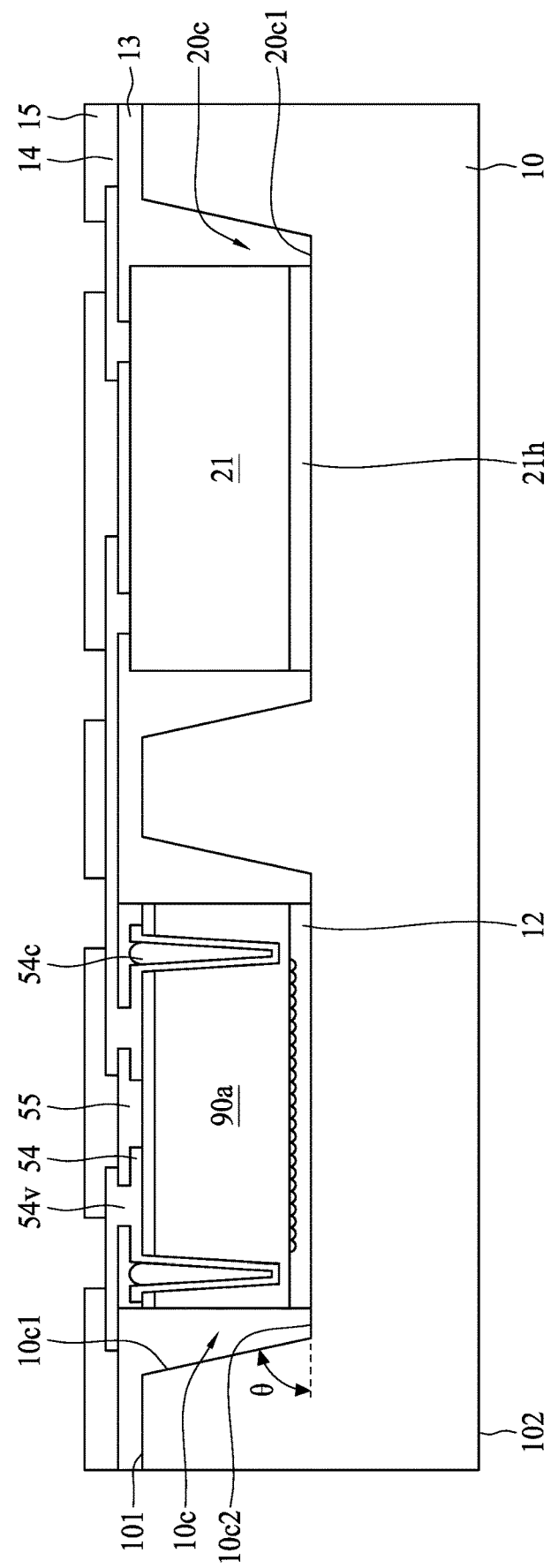

Referring to FIG. 10C, the conductive layer 14 (e.g., RDL) is formed on the passivation layer 13, the optical module 90a and the electronic module 90b to be electrically connected to the exposed portion of the conductive layer 54 of the optical module 90a and the electrical contacts of the electronic component 21. The passivation layer 15 is formed on the passivation layer 13 to cover or encapsulate the passivation layer 13 and the conductive layer 14. One or more openings are then formed to expose a portion of the conductive layer 14.

Figure 10D:
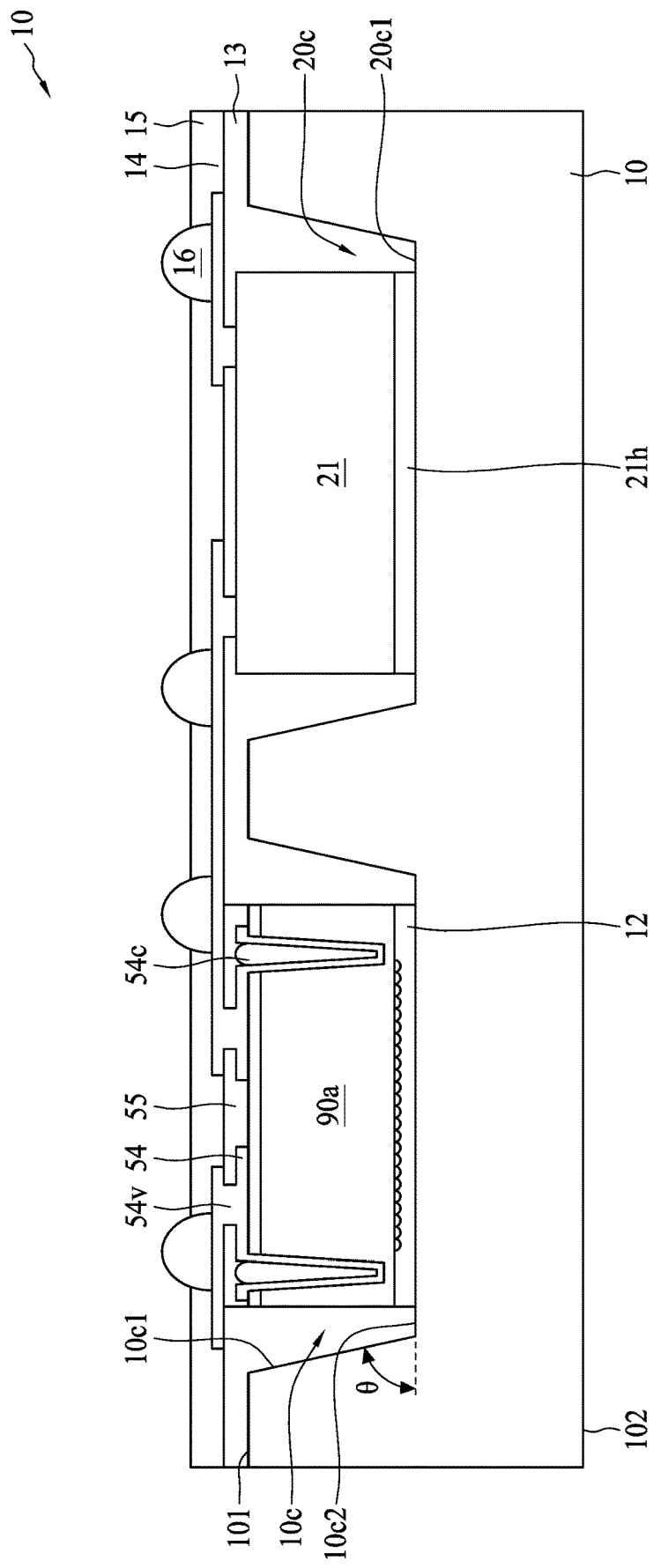

Referring to FIG. 10D, the electrical contacts 16 (e.g., solder balls) are disposed on the exposed portion of the conductive layer 14 to provide electrical connections between the optical module 90a or the electronic component 21 and other circuits, circuit boards or components. Then, a singulation may be performed to separate out individual semiconductor device packages including the semiconductor device package 10. The singulation may be performed, for example, by using a dicing saw, laser or other appropriate cutting technique.

Figure 10E:
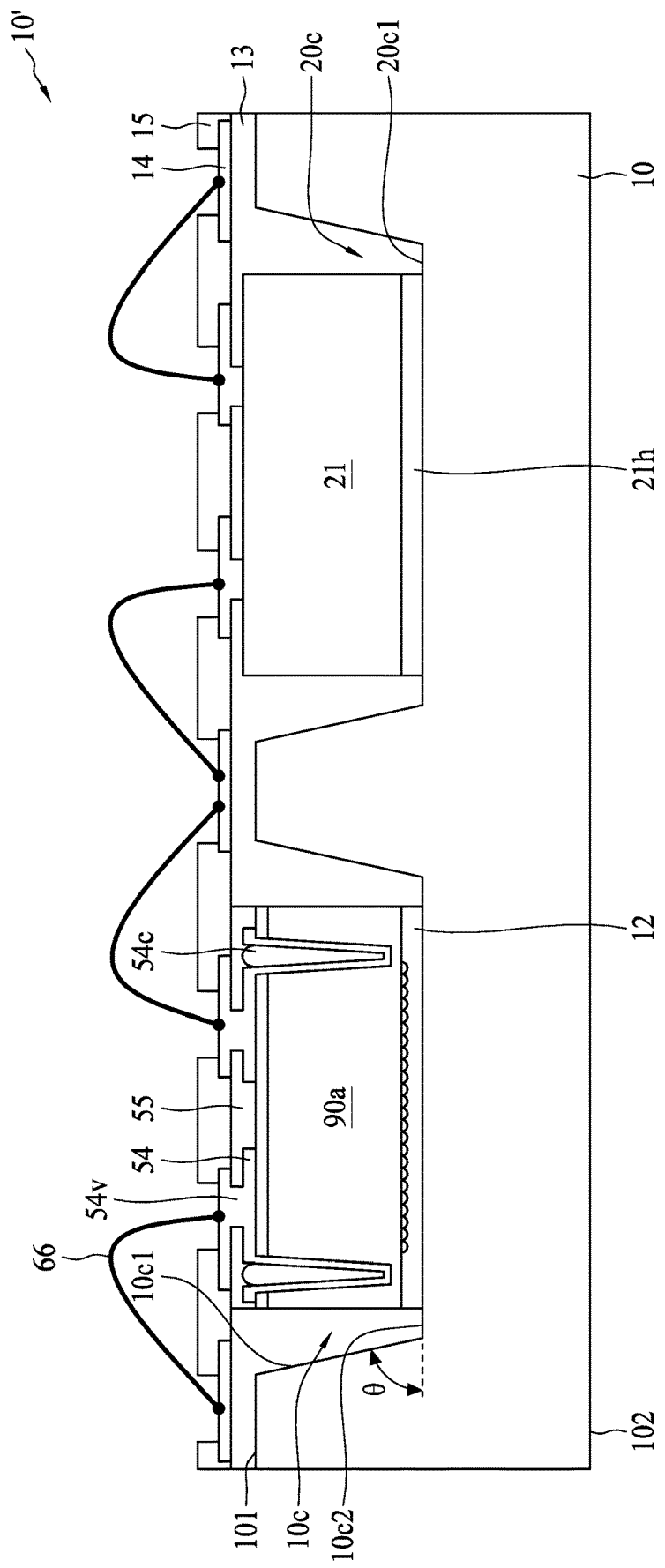

The operation in FIG. 10E is carried out subsequent to the operation in FIG. 10C, the bonding wires 66 are formed on the exposed portion of the conductive layer 14 to provide electrical connections between the optical module 90a or the electronic component 21 and other circuits, circuit boards or components. Then, a singulation may be performed to separate out individual semiconductor device packages including the semiconductor device package 10'. The singulation may be performed, for example, by using a dicing saw, laser or other appropriate cutting technique.

Figure 11A:
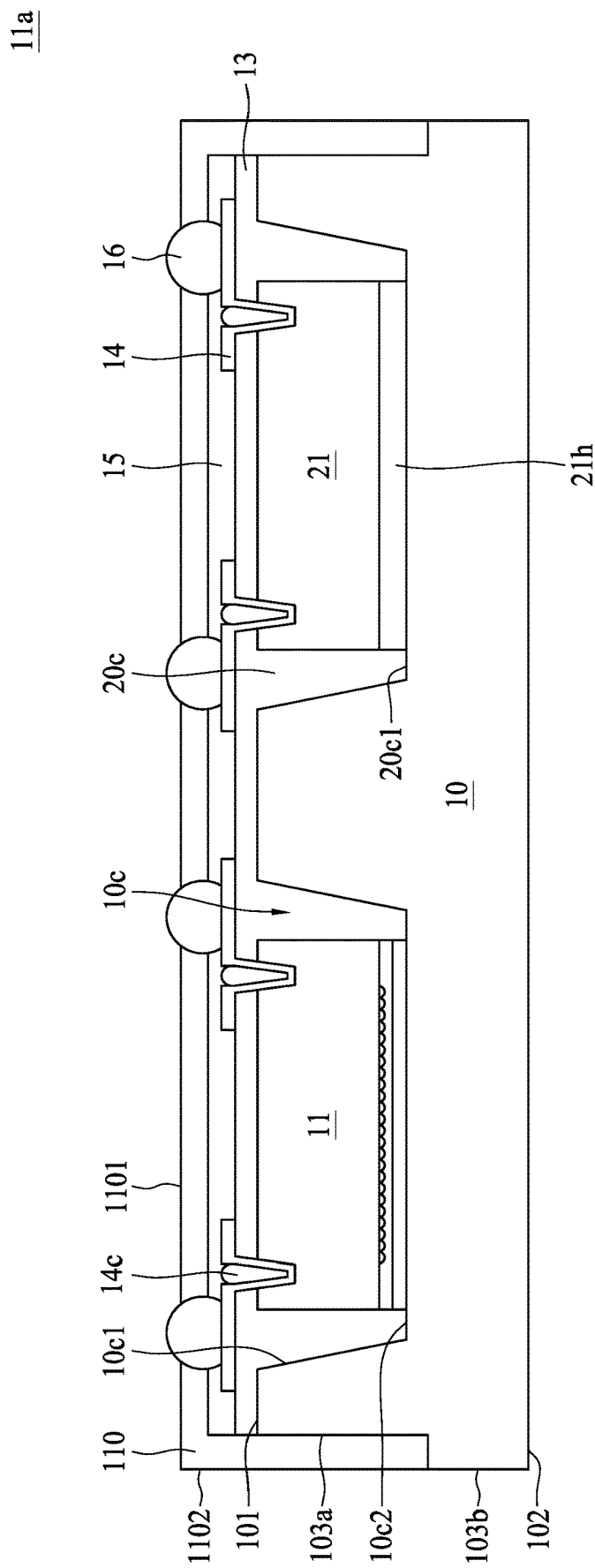
FIG. 11A illustrates a cross-sectional view of a semiconductor device package in accordance with some embodiments of the present disclosure.

FIG. 11A illustrates a cross-sectional view of a semiconductor device package 11a in accordance with some embodiments of the present disclosure. The semiconductor device package 11a is similar to the semiconductor device package 2 in FIG. 2 except that the semiconductor device package 11a further includes a protection layer 110.

The protection layer 110 is disposed on the passivation layer 15 to cover the passivation layer and a portion of the electrical contact 16 and to expose the other portion of the electrical contact 16. In some embodiments, the exposed portion of the electrical contact 16 is not coplanar with a surface 1101 of the protection layer 110. For example, the electrical contact 16 protrudes from the surface 1101 of the protection layer 110. The protection layer 110 is also disposed on a lateral surface 103a of the substrate 10 that is recessed from a lateral surface 103b of the substrate 10. A lateral surface 1102 of the protection layer 110 is substantially coplanar with the lateral surface 103b of the substrate 10. In some embodiments, the protection layer 110 can be a molding compound (e.g., an epoxy molding compound or other molding compound). In some embodiments, the passivation layer 15 can be formed by light blocking materials or light absorbing material to prevent undesired light transmitting into the light receiving area of the optical device 11.

When connecting an optical package on a circuit board or a substrate through electrical contacts (e.g., solder balls), the maximum strain/stress usually occurs at the contour (corners or edges) of the solder balls, which would cause some issues, such as crack, warpage and/or delamination. In some existing approaches, to reduce the strain/stress of the solder balls, an underfill may be used to cover/encapsulate the solder balls after connecting the optical package on the circuit board. However, the use of the underfill will increase the manufacturing time and cost. In accordance with the embodiments as shown in FIG. 11A, the protection layer 110 is disposed to cover a portion of the semiconductor device package 11a to improve the robustness and to reduce the strain/stress, and thus no additional underfill is required when connecting the semiconductor device package 11a to a circuit board or a substrate. In addition, the board level reliability (BLR) can be improved as well.

Figure 11B:
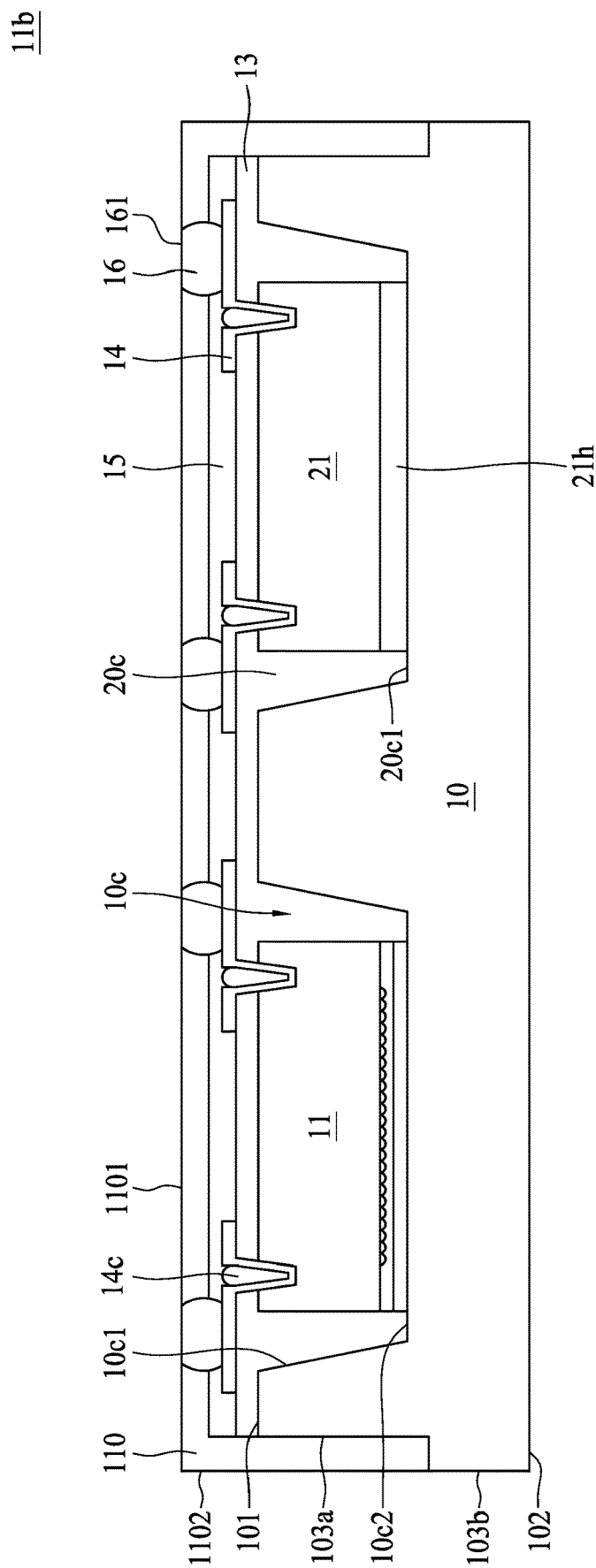
FIG. 11B illustrates a cross-sectional view of a semiconductor device package in accordance with some embodiments of the present disclosure.

FIG. 11B illustrates a cross-sectional view of a semiconductor device package 11b in accordance with some embodiments of the present disclosure. The semiconductor device package 11b is similar to the semiconductor device package 11a in FIG. 11A except that in FIG. 11B, a surface 161 of the electrical contact 16 that is exposed from the protection layer 110 is substantially coplanar with the surface 1101 of the protection layer 110.

Figure 11C:
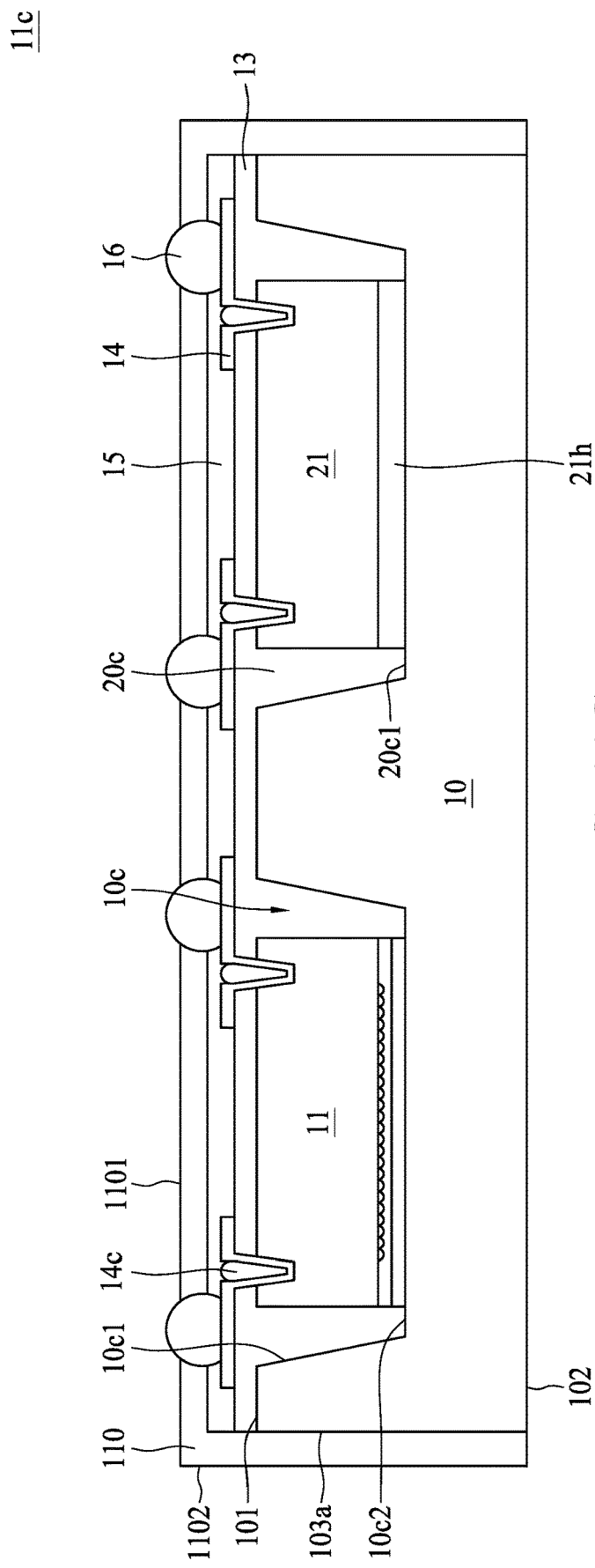
FIG. 11C illustrates a cross-sectional view of a semiconductor device package in accordance with some embodiments of the present disclosure.

FIG. 11C illustrates a cross-sectional view of a semiconductor device package 11c in accordance with some embodiments of the present disclosure. The semiconductor device package 11c is similar to the semiconductor device package 11a in FIG. 11A except that in FIG. 11C, the protection layer 110 fully covers the lateral surface 103a of the substrate 10.

Figure 12A:
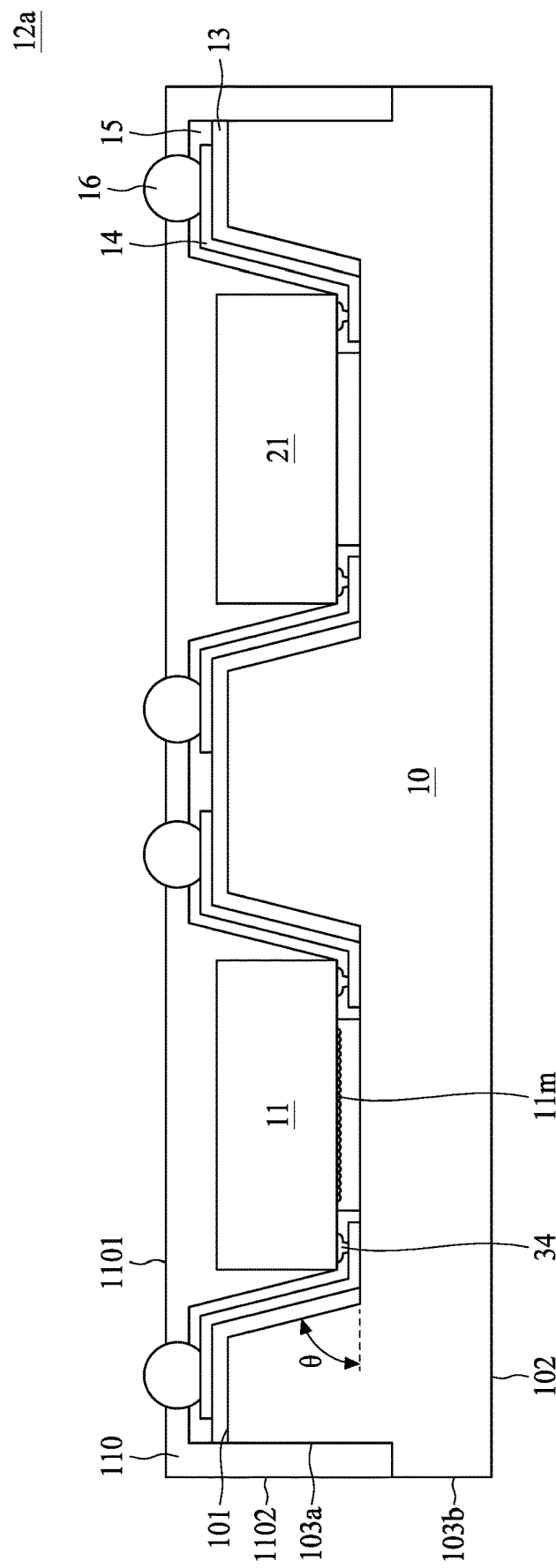
FIG. 12A illustrates a cross-sectional view of a semiconductor device package in accordance with some embodiments of the present disclosure.

FIG. 12A illustrates a cross-sectional view of a semiconductor device package 12a in accordance with some embodiments of the present disclosure. The semiconductor device package 12a is similar to the semiconductor device package 4 in FIG. 4 except that the semiconductor device package 12a further includes a protection layer 110. The protection layer 110 in FIG. 12A is similar to the protection layer 110 in FIG. 11A, and thus the properties, the function and the effect achieved by the protection layer 110 in FIG. 11A can be applicable to FIG. 12A.

Figure 12B:
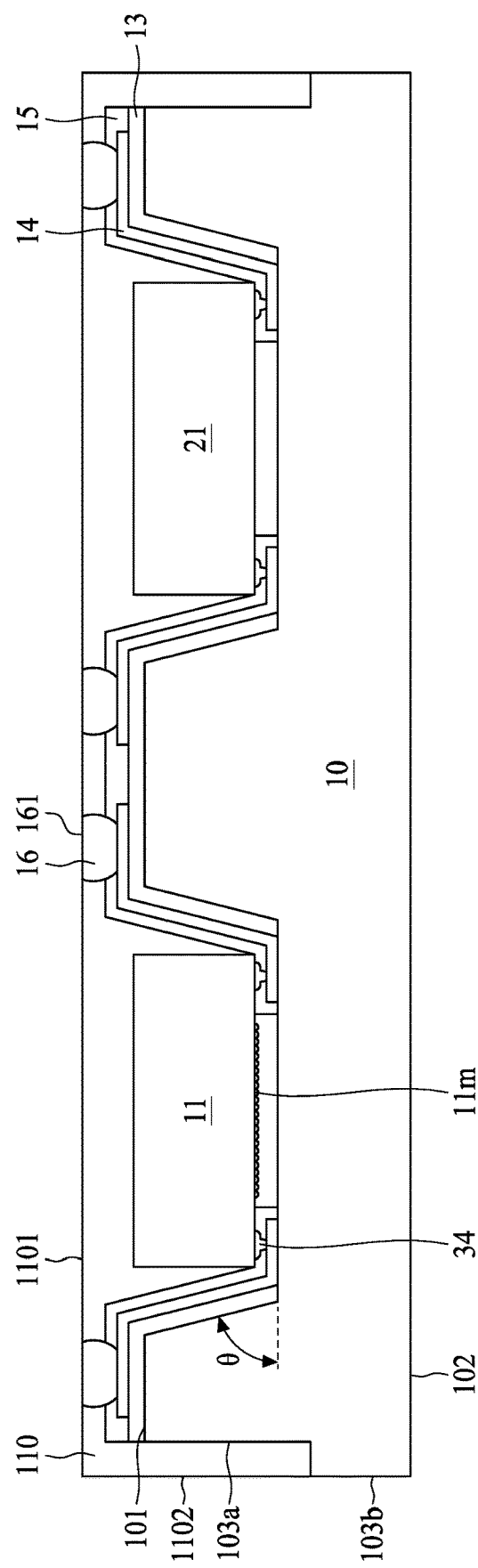
FIG. 12B illustrates a cross-sectional view of a semiconductor device package in accordance with some embodiments of the present disclosure.

FIG. 12B illustrates a cross-sectional view of a semiconductor device package 12b in accordance with some embodiments of the present disclosure. The semiconductor device package 12b is similar to the semiconductor device package 12a in FIG. 12A except that in FIG. 12B, a surface 161 of the electrical contact 16 that is exposed from the protection layer 110 is substantially coplanar with the surface 1101 of the protection layer 110.

Figure 12C:
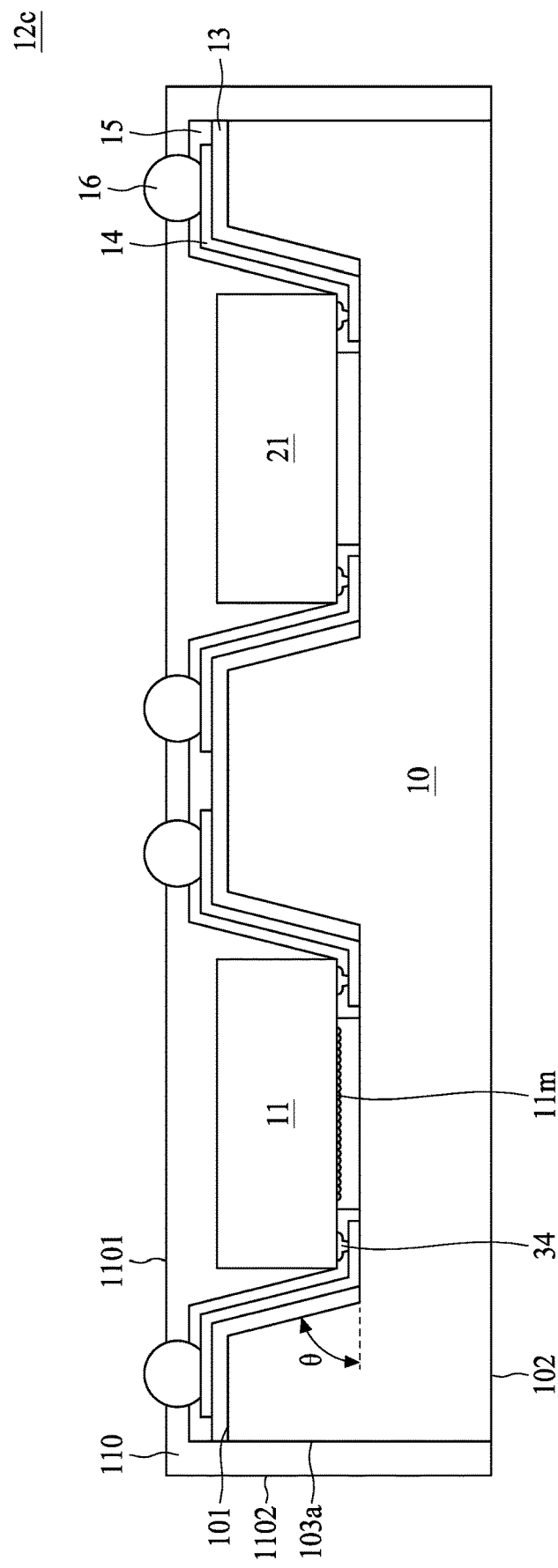
FIG. 12C illustrates a cross-sectional view of a semiconductor device package in accordance with some embodiments of the present disclosure.

FIG. 12C illustrates a cross-sectional view of a semiconductor device package 12c in accordance with some embodiments of the present disclosure. The semiconductor device package 12c is similar to the semiconductor device package 12a in FIG. 12A except that in FIG. 12C, the protection layer 110 fully covers the lateral surface 103a of the substrate 10.

Figure 13A:
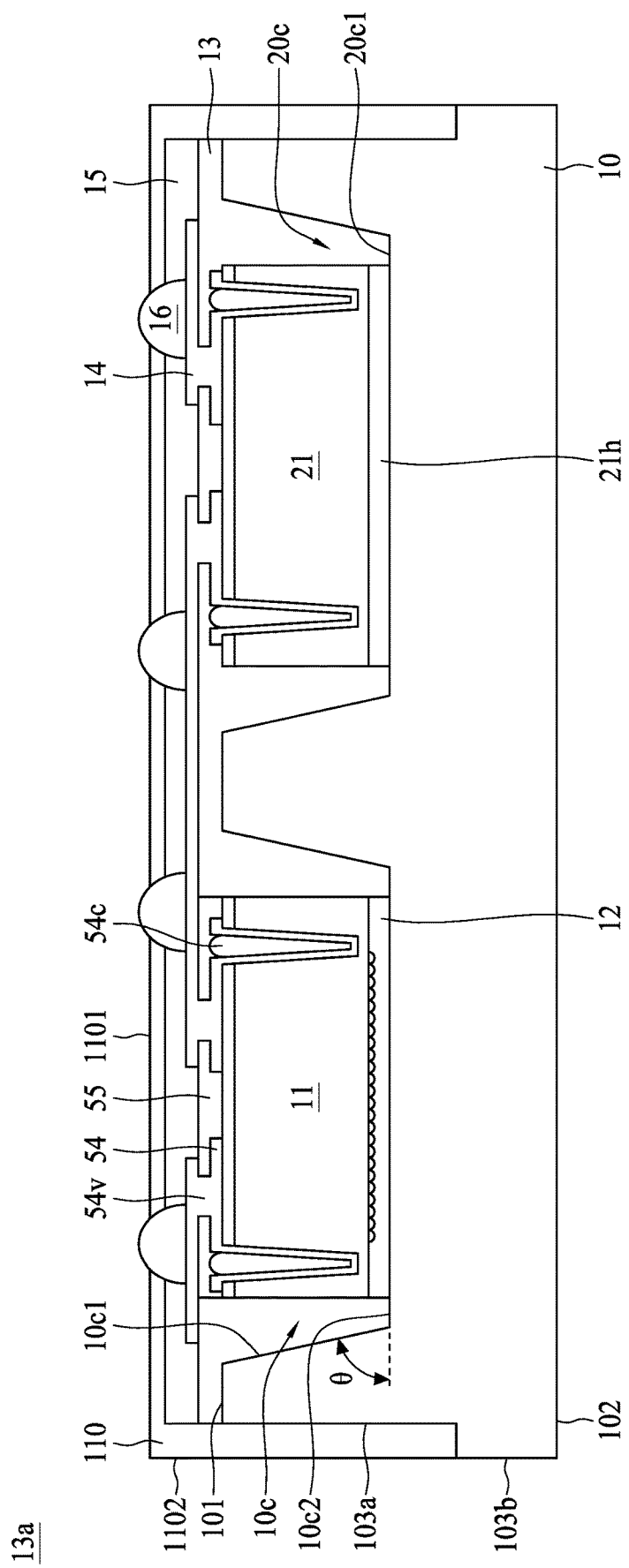
FIG. 13A illustrates a cross-sectional view of a semiconductor device package in accordance with some embodiments of the present disclosure.

FIG. 13A illustrates a cross-sectional view of a semiconductor device package 13a in accordance with some embodiments of the present disclosure. The semiconductor device package 13a is similar to the semiconductor device package 5 in FIG. 5 except that the semiconductor device package 13a further includes a protection layer 110. The protection layer 110 in FIG. 13A is similar to the protection layer 110 in FIG. 11A, and thus the properties, the function and the effect achieved by the protection layer 110 in FIG. 11A can be applicable to FIG. 13A.

Figure 13B:
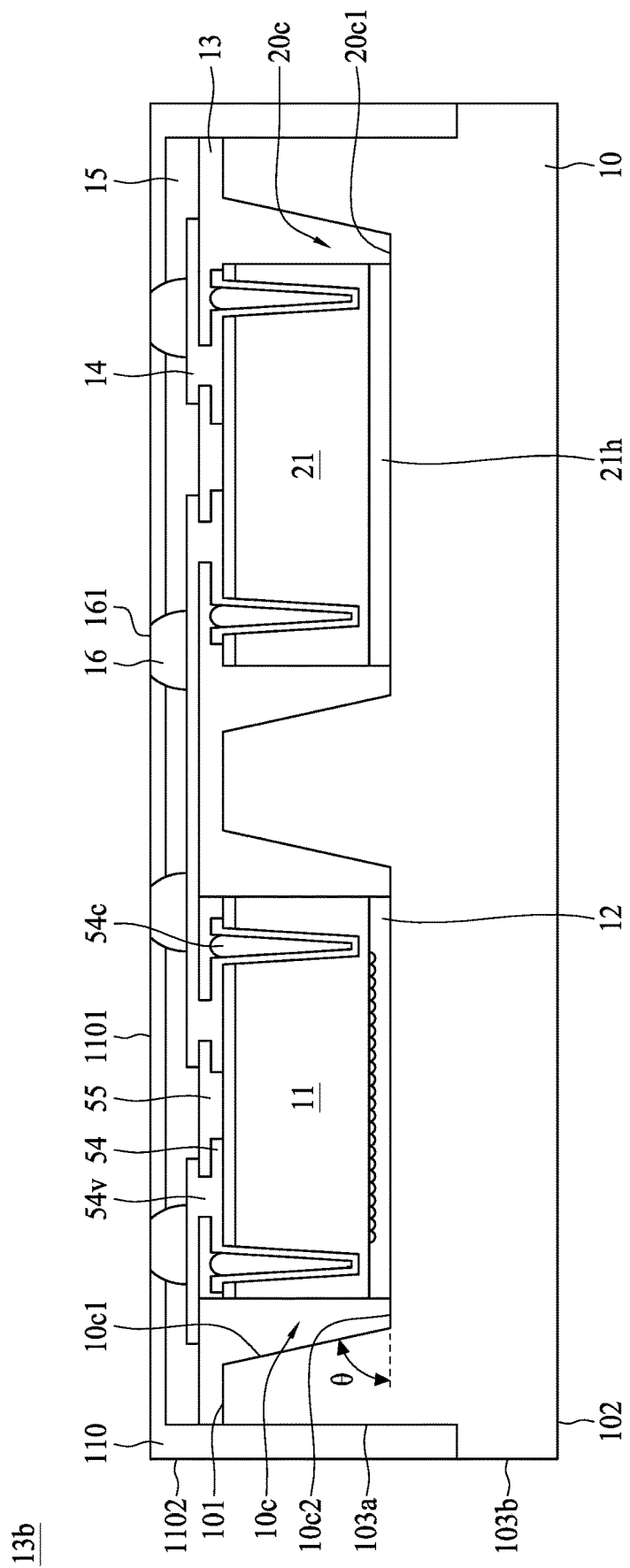
FIG. 13B illustrates a cross-sectional view of a semiconductor device package in accordance with some embodiments of the present disclosure.

FIG. 13B illustrates a cross-sectional view of a semiconductor device package 13b in accordance with some embodiments of the present disclosure. The semiconductor device package 13b is similar to the semiconductor device package 13a in FIG. 13A except that in FIG. 13B, a surface 161 of the electrical contact 16 that is exposed from the protection layer 110 is substantially coplanar with the surface 1101 of the protection layer 110.

Figure 13C:
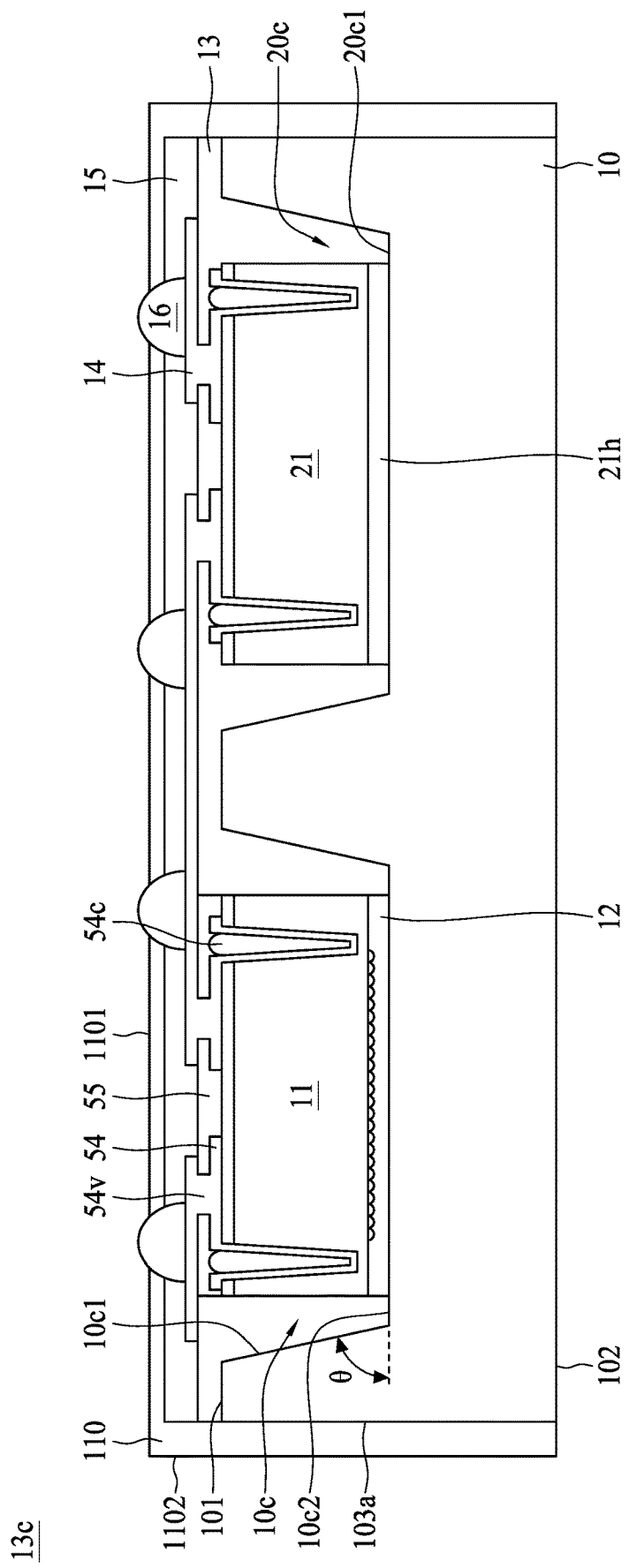
FIG. 13C illustrates a cross-sectional view of a semiconductor device package in accordance with some embodiments of the present disclosure.

FIG. 13C illustrates a cross-sectional view of a semiconductor device package 13c in accordance with some embodiments of the present disclosure. The semiconductor device package 13c is similar to the semiconductor device package 13a in FIG. 13A except that in FIG. 13C, the protection layer 110 fully covers the lateral surface 103a of the substrate 10.

Figure 14A:
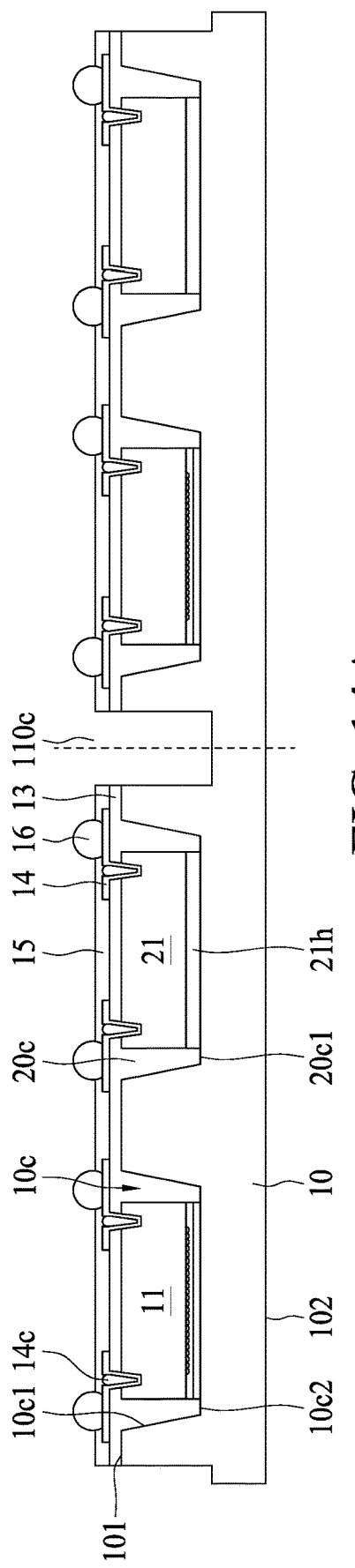
FIGS. 14A, 14B and 14C illustrate multiple stages of a semiconductor package manufacturing process, according to some embodiments of the present disclosure.
Figure 14B:
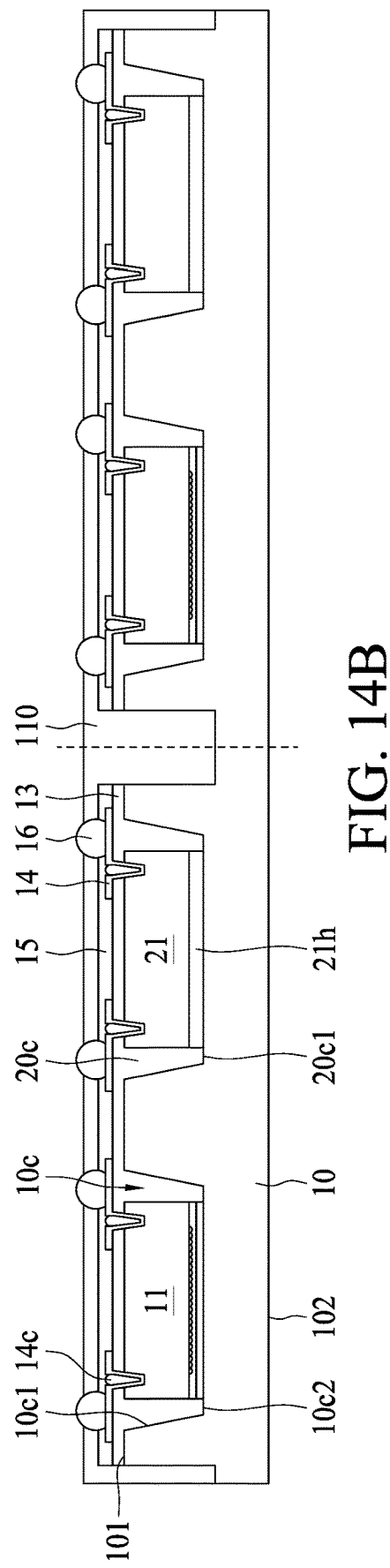
Figure 14C:
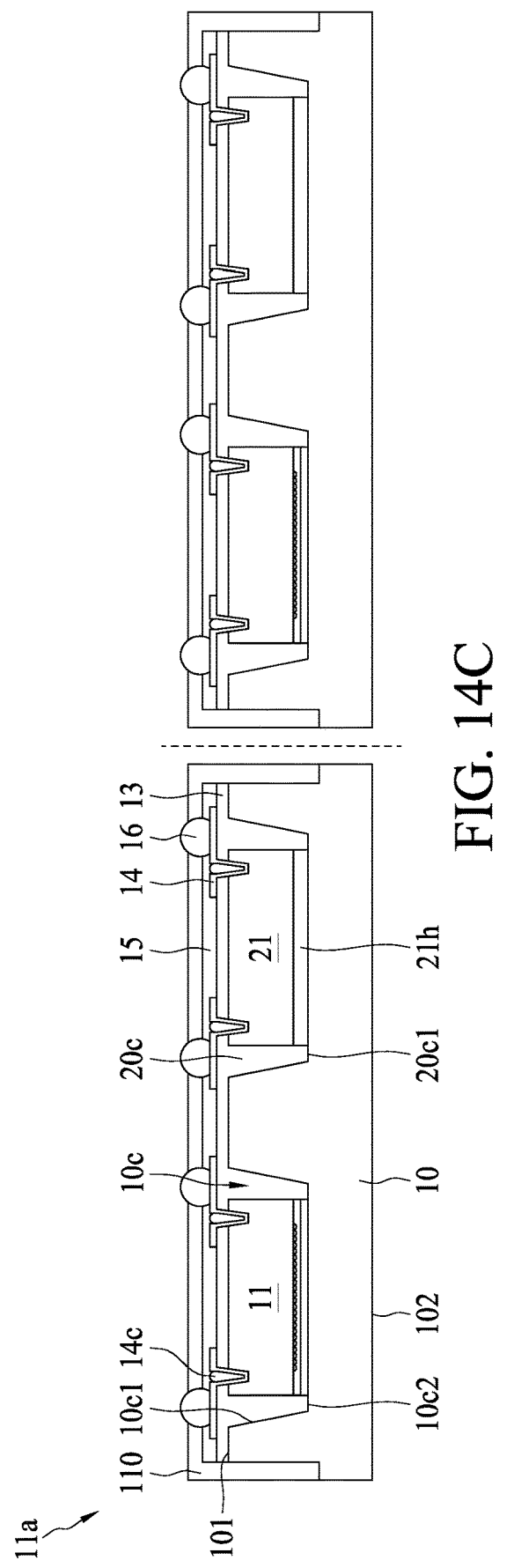

FIGS. 14A, 14B and 14C illustrate various stages of a semiconductor package manufacturing process, according to some embodiments of the present disclosure. In some embodiments, the operation in FIG. 14A is carried out after the operation in FIG. 7F and before the singulation operation.

Referring to FIG. 14A, one or more cavities 110c are formed between two adjacent semiconductor device packages (one semiconductor device package may include an optical device 11 and an electronic component 21) without cutting through the substrate 10. In some embodiments, the cavities 110c may be formed by, dicing saw, laser or other appropriate technique.

Referring to FIG. 14B, the protection layer 110 is formed on the semiconductor device packages and within the cavities 110c. The protection layer 110 covers a portion of the electrical contact 16 and exposes the other portion of the electrical contact 16. In some embodiments, the protection layer 110 can be formed by, for example, wafer level molding (such as compression molding) or other appropriate technique.

Referring to FIG. 14C, a singulation is performed to separate out individual semiconductor device packages including the semiconductor device package 11a. The singulation may be performed, for example, by using a dicing saw, laser or other appropriate cutting technique.

Figure 15A:
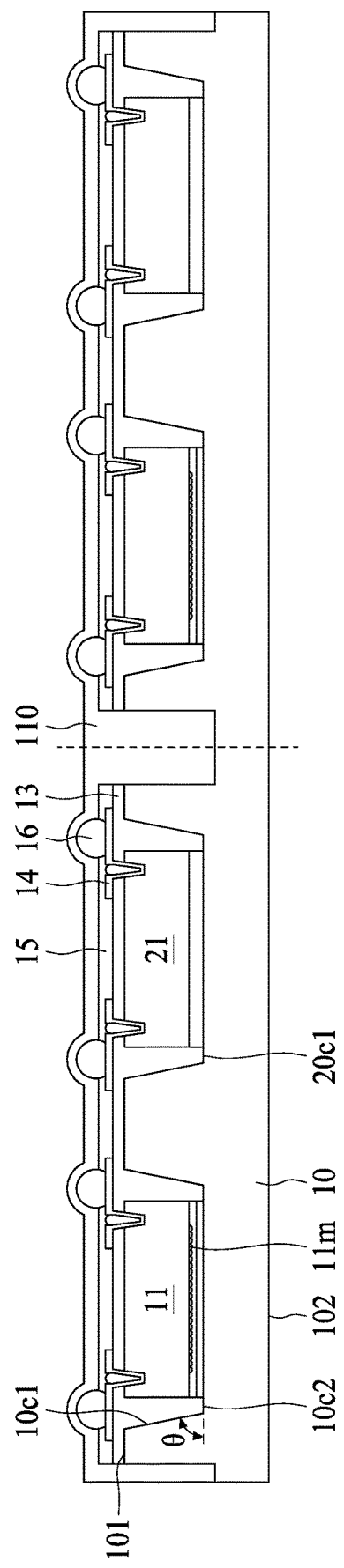
FIGS. 15A, 15B and 15C illustrate multiple stages of a semiconductor package manufacturing process, according to some embodiments of the present disclosure.
Figure 15B:
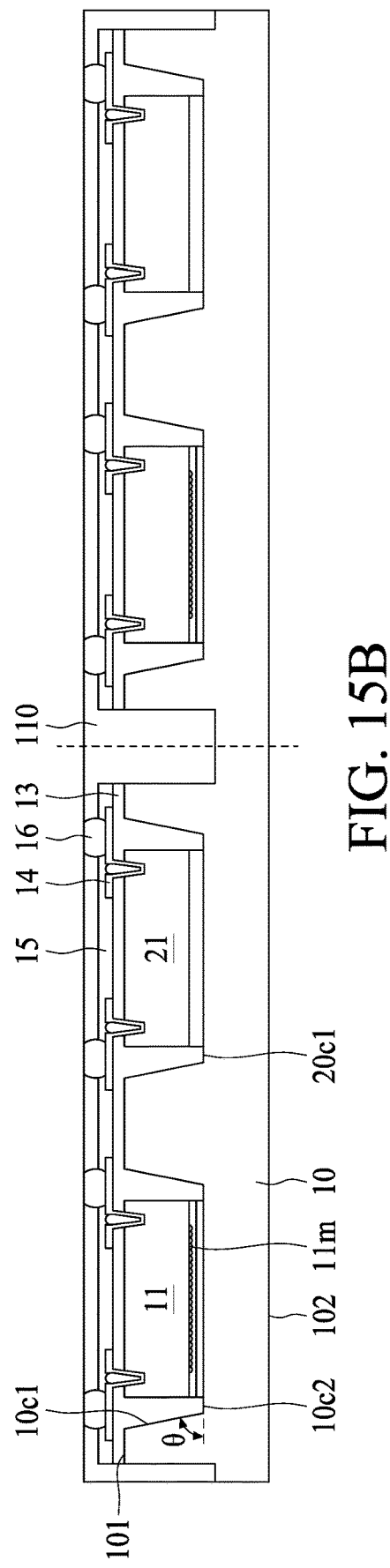
Figure 15C:
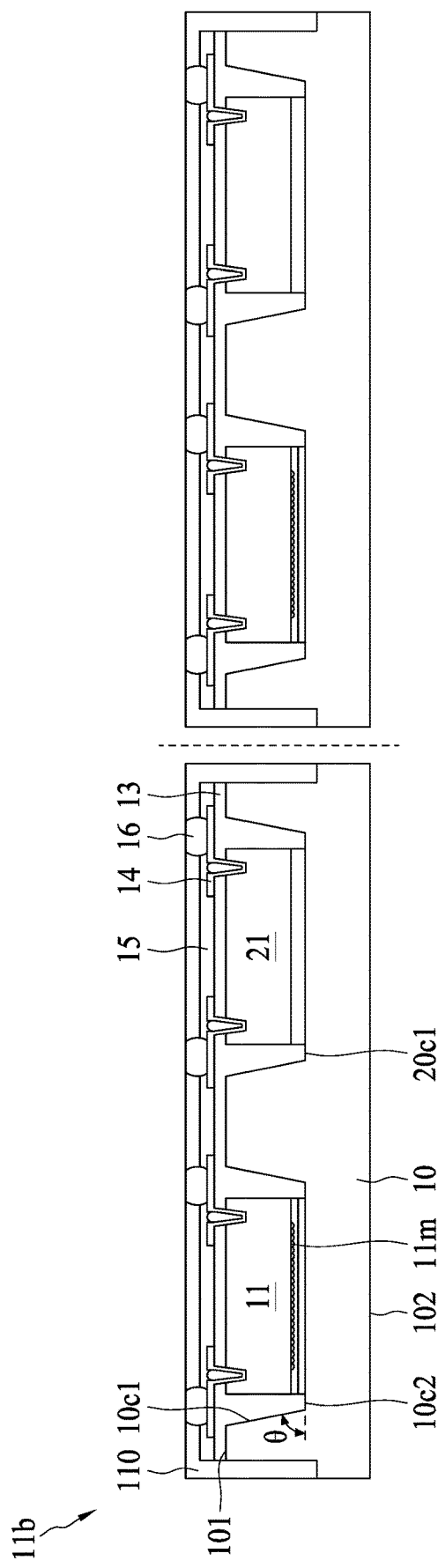

FIGS. 15A, 15B and 15C illustrate various stages of a semiconductor package manufacturing process, according to some embodiments of the present disclosure. In some embodiments, the operation in FIG. 15A is carried out after the operation in FIG. 14A.

Referring to FIG. 15A, the protection layer 110 is formed on the semiconductor device packages and within the cavities 110c. The protection layer 110 fully covers the electrical contact 16. In some embodiments, the protection layer 110 can be formed by, for example, wafer level molding (such as transfer molding), printing or other appropriate technique.

Referring to FIG. 15B, a grinding or planarization operation is carried out to remove a portion of the protection layer 110 and the electrical contact 16 to expose a portion of the electrical contact 16.

Referring to FIG. 15C, a singulation is performed to separate out individual semiconductor device packages including the semiconductor device package 11b. The singulation may be performed, for example, by using a dicing saw, laser or other appropriate cutting technique.

Figure 16A:
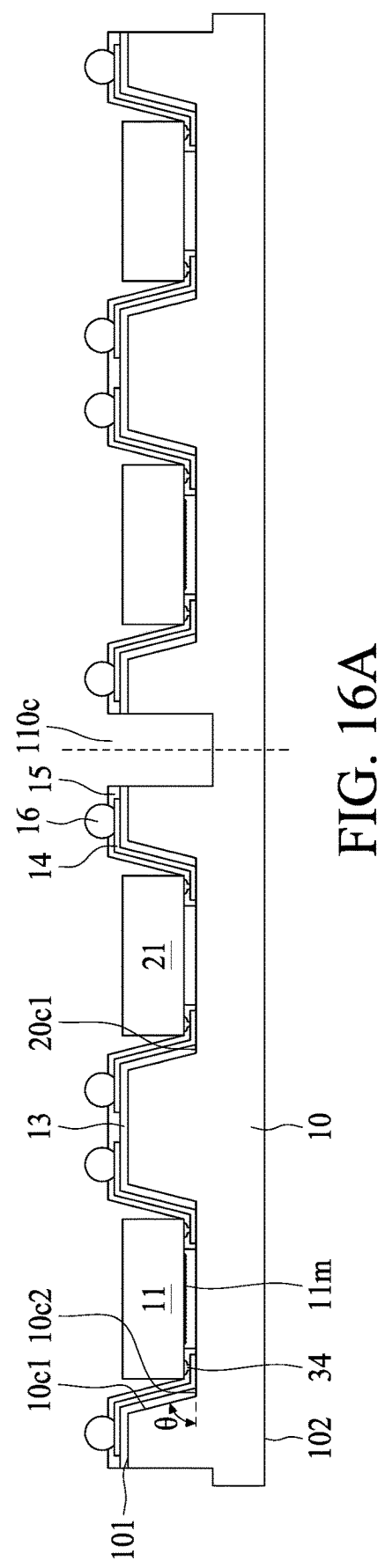
FIGS. 16A, 16B and 16C illustrate multiple stages of a semiconductor package manufacturing process, according to some embodiments of the present disclosure.
Figure 16B:
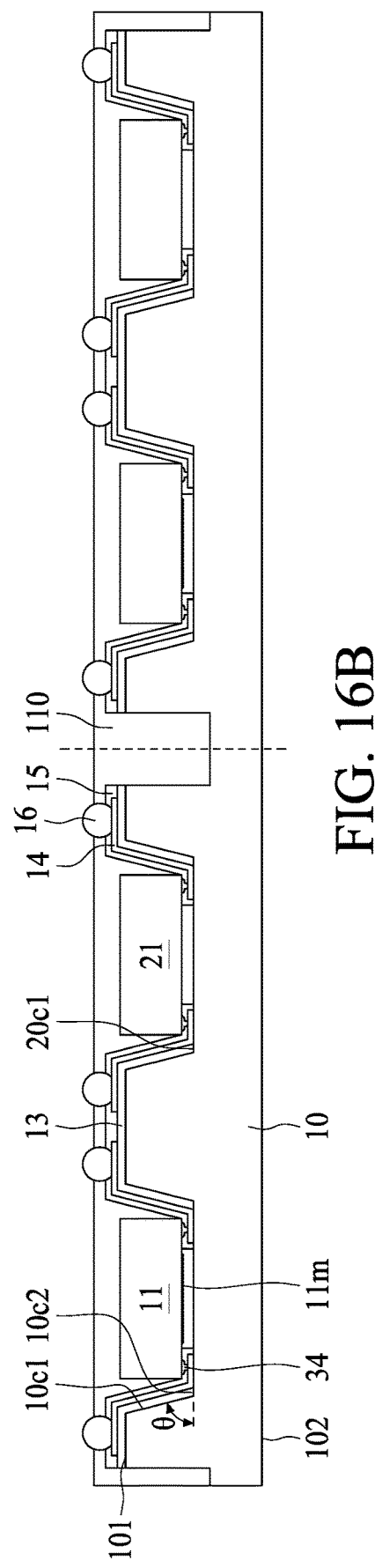
Figure 16C:
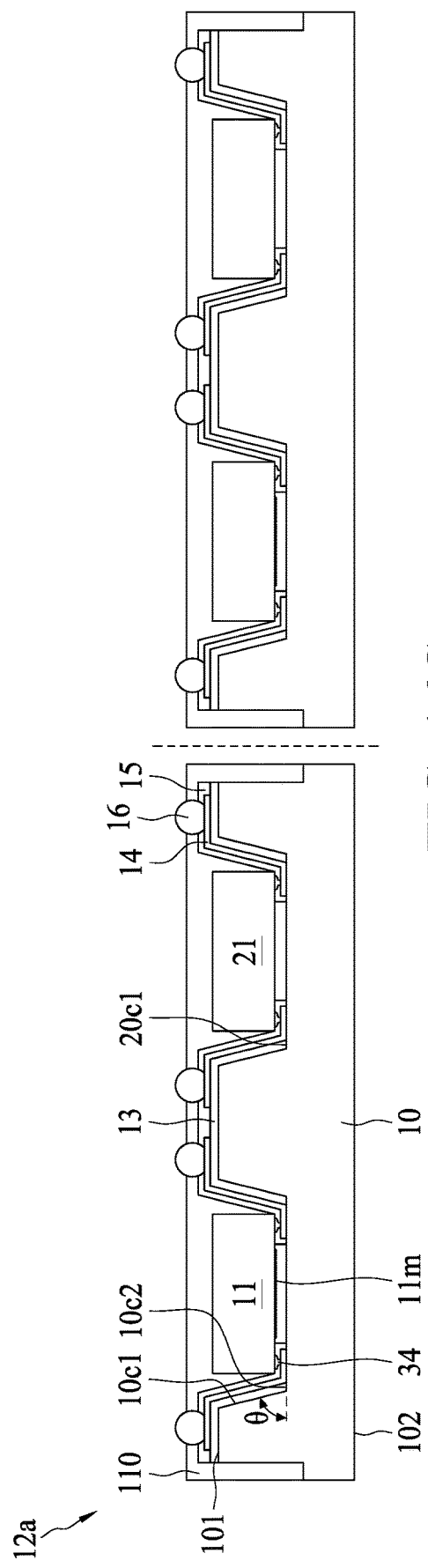

FIGS. 16A, 16B and 16C illustrate various stages of a semiconductor package manufacturing process, according to some embodiments of the present disclosure. In some embodiments, the operation in FIG. 16A is carried out after the operation in FIG. 8E and before the singulation operation.

Referring to FIG. 16A, one or more cavities 110c are formed between two adjacent semiconductor device packages (one semiconductor device package may include an optical device 11 and an electronic component 21) without cutting through the substrate 10. In some embodiments, the cavities 110c may be formed by, dicing saw, laser or other appropriate technique.

Referring to FIG. 16B, the protection layer 110 is formed on the semiconductor device packages and within the cavities 110c. The protection layer 110 covers a portion of the electrical contact 16 and exposes the other portion of the electrical contact 16. In some embodiments, the protection layer 110 can be formed by, for example, wafer level molding (such as compression molding) or other appropriate technique.

Referring to FIG. 16C, a singulation is performed to separate out individual semiconductor device packages including the semiconductor device package 12a. The singulation may be performed, for example, by using a dicing saw, laser or other appropriate cutting technique.

Figure 17A:
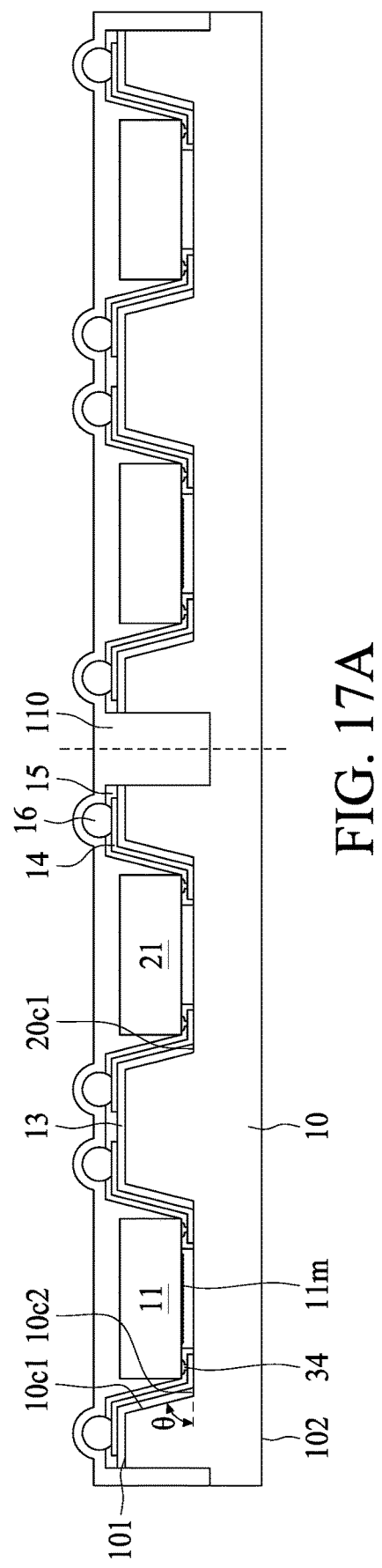
FIGS. 17A, 17B and 17C illustrate multiple stages of a semiconductor package manufacturing process, according to some embodiments of the present disclosure.
Figure 17B:
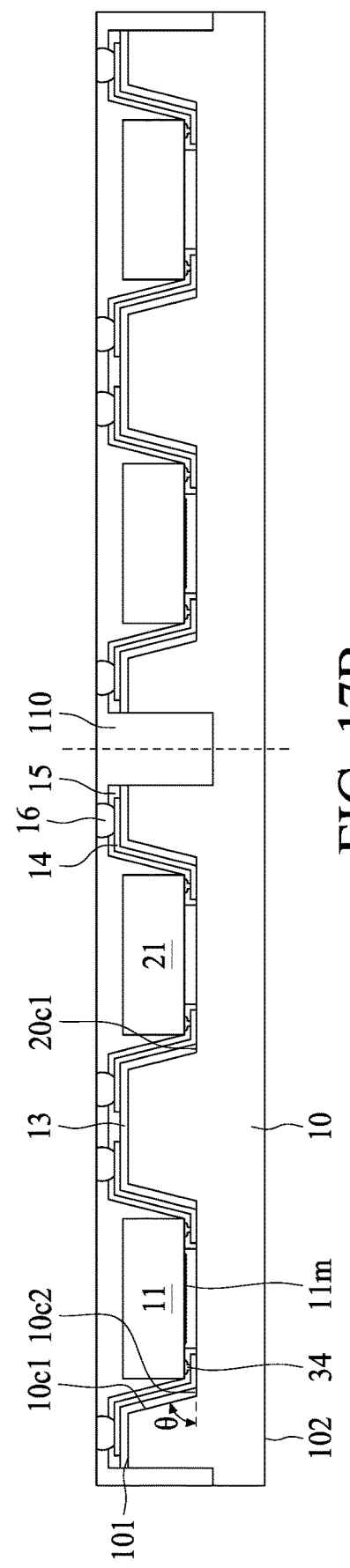
Figure 17C:
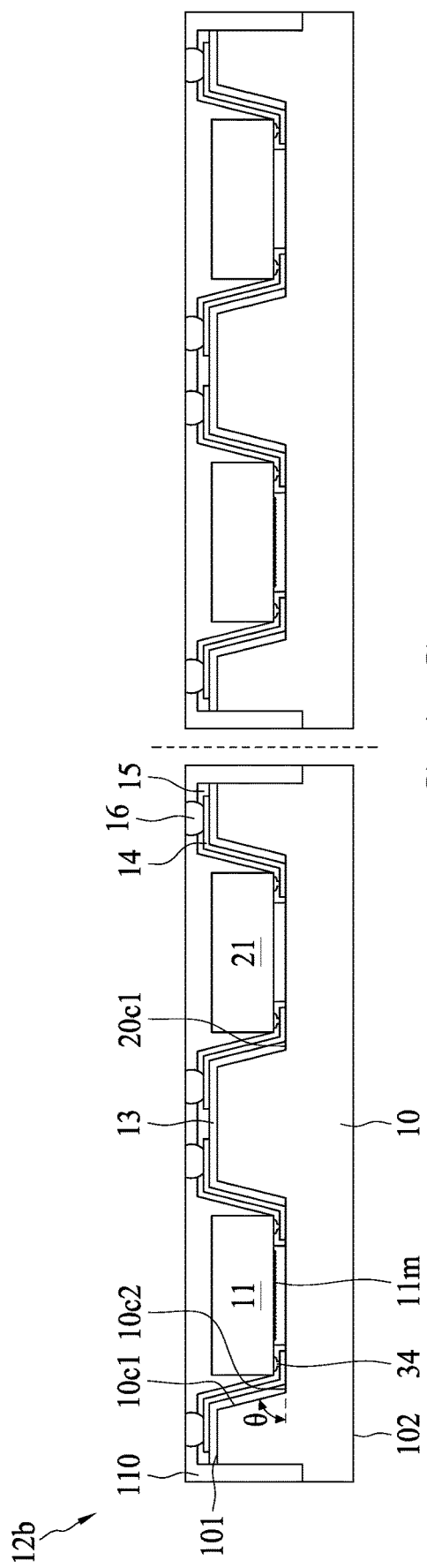

FIGS. 17A, 17B and 17C illustrate various stages of a semiconductor package manufacturing process, according to some embodiments of the present disclosure. In some embodiments, the operation in FIG. 17A is carried out after the operation in FIG. 16A.

Referring to FIG. 17A, the protection layer 110 is formed on the semiconductor device packages and within the cavities 110c. The protection layer 110 fully covers the electrical contact 16. In some embodiments, the protection layer 110 can be formed by, for example, wafer level molding (such as transfer molding), printing or other appropriate technique.

Referring to FIG. 17B, a grinding or planarization operation is carried out to remove a portion of the protection layer 110 and the electrical contact 16 to expose a portion of the electrical contact 16.

Referring to FIG. 17C, a singulation is performed to separate out individual semiconductor device packages including the semiconductor device package 12b. The singulation may be performed, for example, by using a dicing saw, laser or other appropriate cutting technique.

Figure 18A:
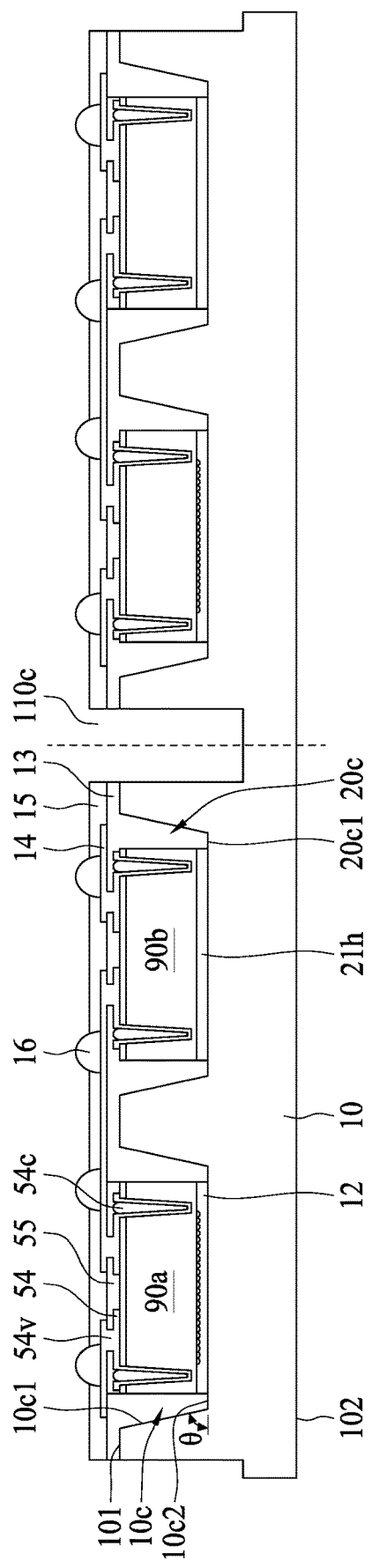
FIGS. 18A, 18B and 18C illustrate multiple stages of a semiconductor package manufacturing process, according to some embodiments of the present disclosure.
Figure 18B:
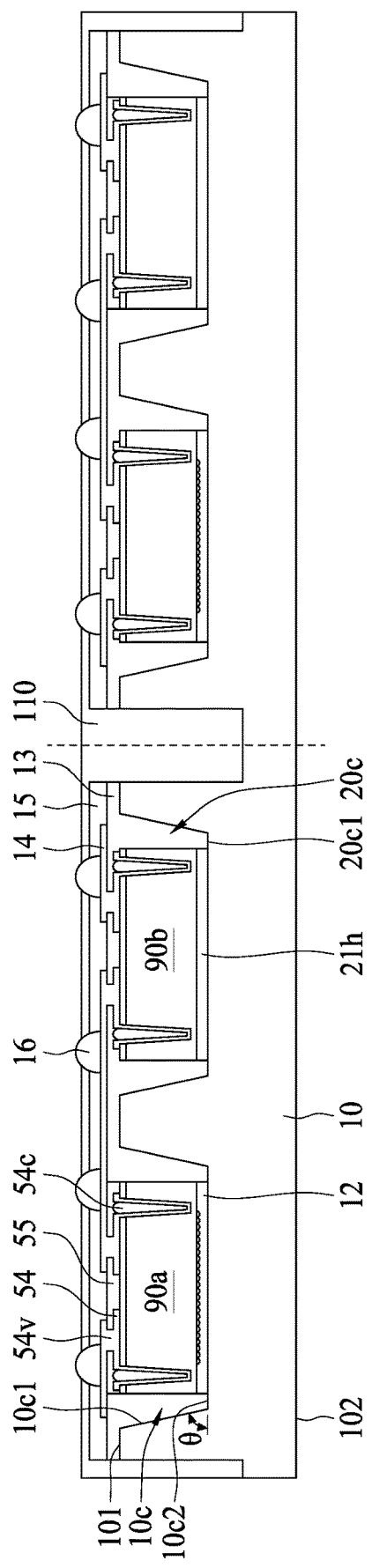
Figure 18C:
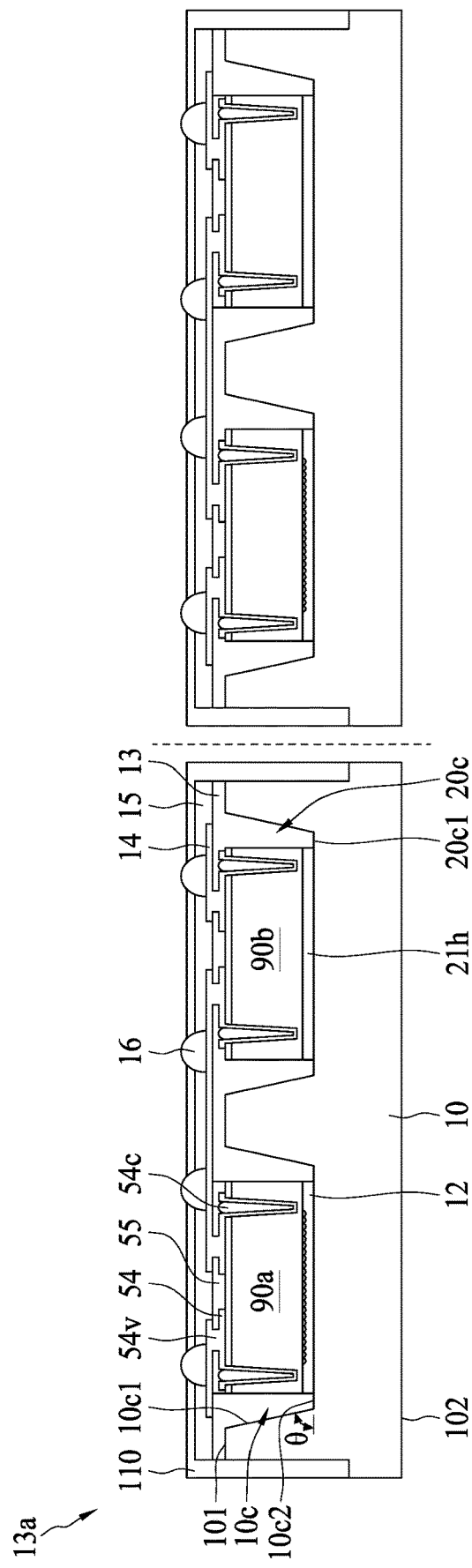

FIGS. 18A, 18B and 18C illustrate various stages of a semiconductor package manufacturing process, according to some embodiments of the present disclosure. In some embodiments, the operation in FIG. 18A is carried out after the operation in FIG. 9D and before the singulation operation.

Referring to FIG. 18A, one or more cavities 110c are formed between two adjacent semiconductor device packages (one semiconductor device package may include an optical device 11 and an electronic component 21) without cutting through the substrate 10. In some embodiments, the cavities 110c may be formed by, dicing saw, laser or other appropriate technique.

Referring to FIG. 18B, the protection layer 110 is formed on the semiconductor device packages and within the cavities 110c. The protection layer 110 covers a portion of the electrical contact 16 and exposes the other portion of the electrical contact 16. In some embodiments, the protection layer 110 can be formed by, for example, wafer level molding (such as compression molding) or other appropriate technique.

Referring to FIG. 18C, a singulation is performed to separate out individual semiconductor device packages including the semiconductor device package 13a. The singulation may be performed, for example, by using a dicing saw, laser or other appropriate cutting technique.

Figure 19A:
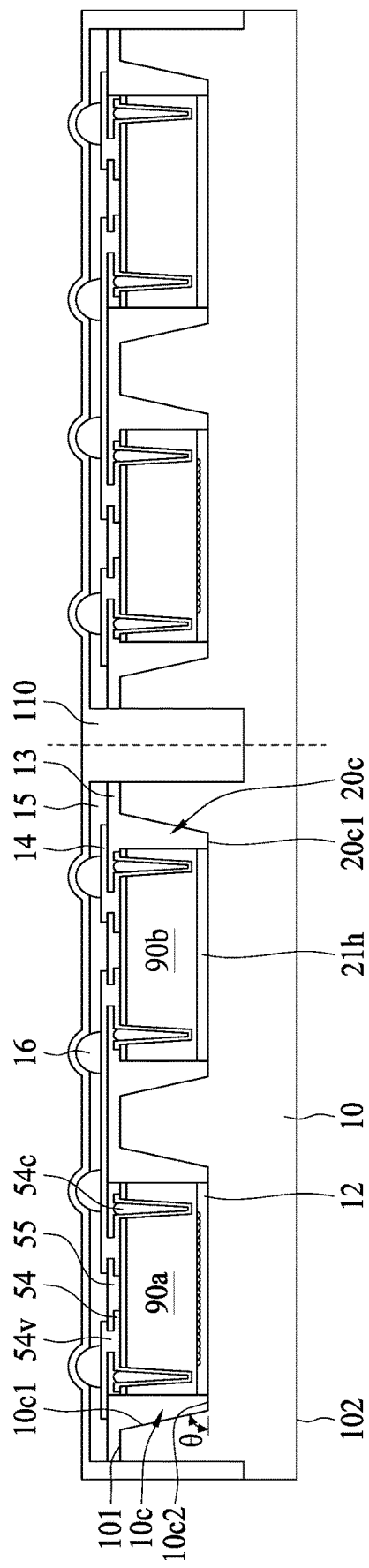
FIGS. 19A, 19B and 19C illustrate multiple stages of a semiconductor package manufacturing process, according to some embodiments of the present disclosure.
Figure 19B:
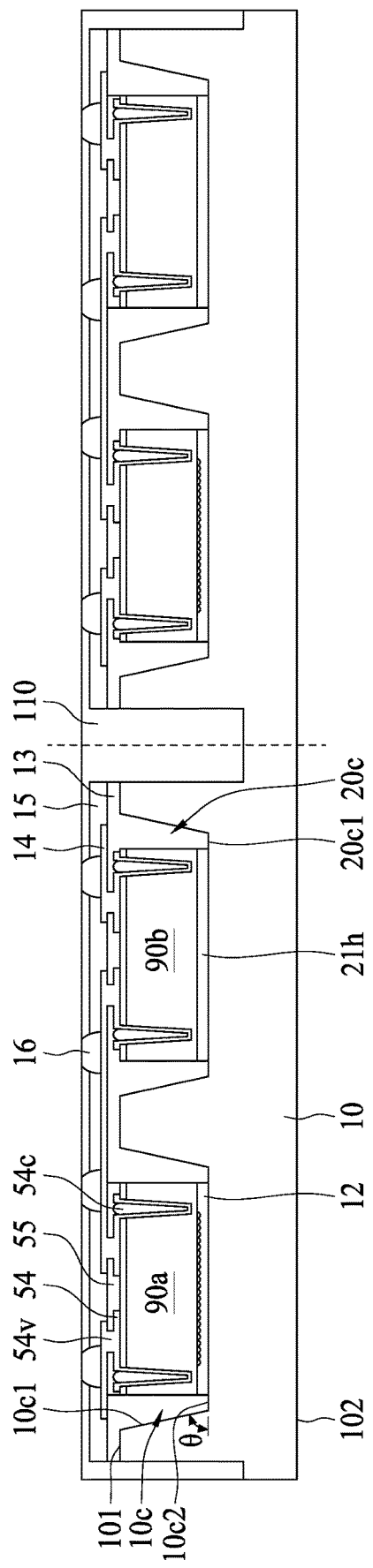
Figure 19C:
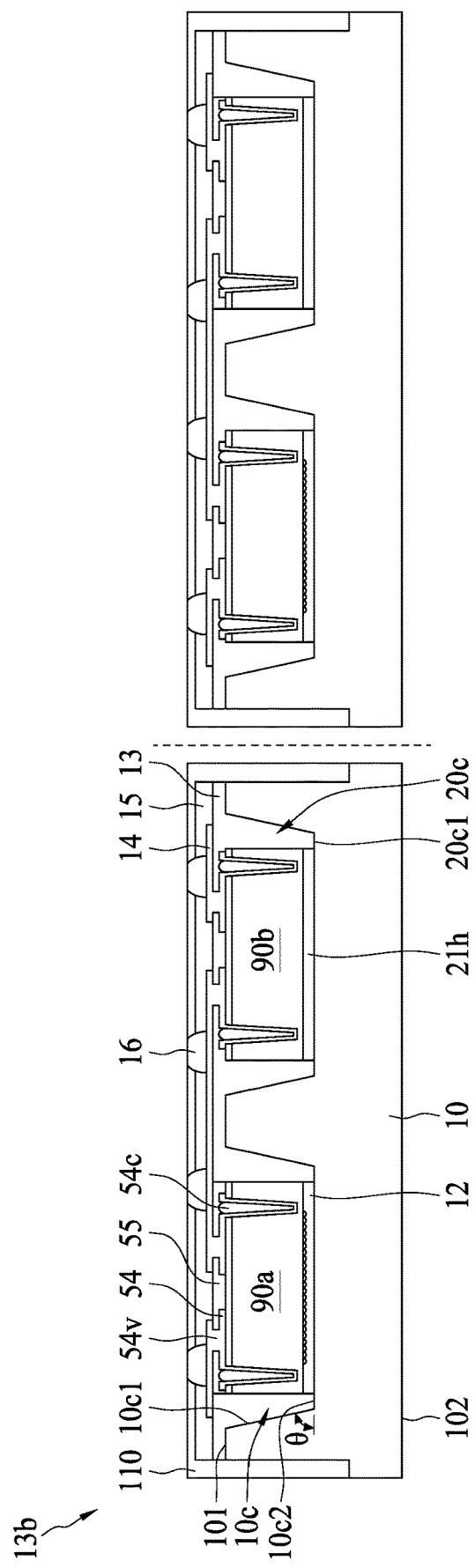

FIGS. 19A, 19B and 19C illustrate various stages of a semiconductor package manufacturing process, according to some embodiments of the present disclosure. In some embodiments, the operation in FIG. 19A is carried out after the operation in FIG. 18A.

Referring to FIG. 19A, the protection layer 110 is formed on the semiconductor device packages and within the cavities 110c. The protection layer 110 fully covers the electrical contact 16. In some embodiments, the protection layer 110 can be formed by, for example, wafer level molding (such as transfer molding), printing or other appropriate technique.

Referring to FIG. 19B, a grinding or planarization operation is carried out to remove a portion of the protection layer 110 and the electrical contact 16 to expose a portion of the electrical contact 16.

Referring to FIG. 19C, a singulation is performed to separate out individual semiconductor device packages including the semiconductor device package 13b. The singulation may be performed, for example, by using a dicing saw, laser or other appropriate cutting technique.

In the description of some embodiments, a component provided "on" another component can encompass cases where the former component is directly on (e.g., in physical contact with) the latter component, as well as cases where one or more intervening components are located between the former component and the latter component.

In the description of some embodiments, a component characterized as "light transmitting" or "transparent" can refer to such a component as having a light transmittance of at least 80%, such as at least 85% or at least 90%, over a relevant wavelength or a relevant range of wavelengths, such as a peak infrared wavelength or a range of infrared wavelengths emitted by a light emitter. In the description of some embodiments, a component characterized as "light shielding," "light blocking," or "opaque" can refer to such a component as having a light transmittance of no greater than 20%, such as no greater than 15% or no greater than 10%, over a relevant wavelength or a relevant range of wavelengths, such as a peak infrared wavelength or a range of infrared wavelengths emitted by a light emitter.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It will be clearly understood by those skilled in the art that various changes may be made, and equivalents may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it should be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a transparent substrate having a first surface, the transparent substrate having a first cavity underneath the first surface of the transparent substrate;
    a photo detector disposed within the first cavity, the photo detector having a sensing area facing toward a bottom surface of the first cavity of the transparent substrate;
    a first conductive layer disposed over the transparent substrate and electrically connected to the photo detector; and
    a first passivation layer disposed on the first surface and sidewall of the first cavity, wherein part of the photo detector is exposed from the first passivation layer.

2. The semiconductor device package of claim 1, wherein the first passivation layer disposed on the first surface of the transparent substrate and within the first cavity to cover the photo detector.

3. The semiconductor device package of claim 2, wherein the first conductive layer is disposed on the first passivation layer and penetrates the first passivation layer to be electrically connected to the photo detector.

4. The semiconductor device package of claim 2, further comprising:
    a second passivation layer disposed on the first passivation layer and covers the conducive layer, the second passivation layer having one or more openings to expose a portion of the first conductive layer; and
    one or more solder balls disposed within the openings to be electrically connected to the first conductive layer.

5. The semiconductor device package of claim 2, further comprising a second conductive layer disposed on a backside surface of the photo detector and penetrating the photo detector to be electrically connected to the photo detector.

6. The semiconductor device package of claim 5, wherein the second conductive layer is electrically connected to the first conductive layer through a conductive via.

7. The semiconductor device package of claim 1, wherein the first conductive layer is disposed on the first passivation layer and a portion of the bottom surface of the first cavity.

8. The semiconductor device package of claim 7, further comprising a second passivation layer disposed on the conducive layer and exposing a portion of the first conductive layer, wherein the photo detector is electrically connected to the exposed portion of the first conductive layer.

9. The semiconductor device package of claim 8, wherein the photo detector is electrically connected to the exposed portion of the first conductive layer through a stub bump, a pillar or a solder ball.

10. The semiconductor device package of claim 1, further comprising a micro lens disposed between the sensing area of the photo detector and the bottom surface of the first cavity.

11. The semiconductor device package of claim 1, wherein the transparent substrate is a glass substrate.

12. The semiconductor device package of claim 1, wherein the photo detector is spaced apart from sidewall of the first cavity of the transparent substrate.

13. The semiconductor device package of claim 1, wherein
    the transparent substrate further includes a second cavity from the first surface of the transparent substrate into the transparent substrate for accommodating a non-optical component; and
    the second cavity is separated from the first cavity.

14. The semiconductor device package of claim 1, wherein an angle defined by the bottom surface of the cavity with respect to sidewall of the cavity is greater than 0 and equal to or less than 90 degrees.

15. The semiconductor device package of claim 1, further comprising a protection layer disposed on the first surface and a lateral surface of the transparent substrate.

16. The semiconductor device package of claim 15, wherein
    the lateral surface of the transparent substrate further includes a first lateral surface and a second lateral surface that is not coplanar with the first lateral surface; and
    the protection layer is disposed on the first lateral surface of the transparent substrate and exposes the second lateral surface of the transparent substrate.

* * * * *

UNITED STATES PATENT AND TRADEMARK OFFICE
CERTIFICATE OF CORRECTION

PATENT NO. : 10,985,149 B2
APPLICATION NO. : 16/248125
DATED : April 20, 2021
INVENTOR(S) : Chien Chan Yeh, Ying-Chih Kuo and Wei-Feng Lin Page 1 of 1

It is certified that error appears in the above-identified patent and that said Letters Patent is hereby corrected as shown below:

In the Claims

Claim 4 - In Column 15, Line 39 change "conducive" to --first conductive--.

Claim 8 - In Column 16, Line 9 change "conducive" to --first conductive--.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*